(12) United States Patent
Tsukamoto

(10) Patent No.: US 11,737,282 B2
(45) Date of Patent: Aug. 22, 2023

(54) SEMICONDUCTOR STORAGE DEVICE, MANUFACTURING METHOD OF SEMICONDUCTOR STORAGE DEVICE, AND ELECTRONIC DEVICE

(71) Applicant: SONY SEMICONDUCTOR SOLUTIONS CORPORATION, Kanagawa (JP)

(72) Inventor: Masanori Tsukamoto, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 206 days.

(21) Appl. No.: 16/968,761

(22) PCT Filed: Feb. 12, 2019

(86) PCT No.: PCT/JP2019/004769
§ 371 (c)(1),
(2) Date: Aug. 10, 2020

(87) PCT Pub. No.: WO2019/171884
PCT Pub. Date: Sep. 12, 2019

(65) Prior Publication Data
US 2021/0013218 A1 Jan. 14, 2021

(30) Foreign Application Priority Data
Mar. 7, 2018 (JP) .................................. 2018-040988

(51) Int. Cl.
*H10B 53/30* (2023.01)
*H10B 53/10* (2023.01)
(52) U.S. Cl.
CPC ............. *H10B 53/30* (2023.02); *H10B 53/10* (2023.02)

(58) Field of Classification Search
CPC ....... H01L 2924/1441; H01L 27/11504; H01L 27/11507; H10B 53/10; H10B 53/30
See application file for complete search history.

(56) References Cited

U.S. PATENT DOCUMENTS

| 6,222,215 B1* | 4/2001 | Zahurak ............ H01L 27/10835 |
| | | 257/E21.651 |
| 2006/0002170 A1* | 1/2006 | Kumura .................. H01L 28/65 |
| | | 257/295 |

(Continued)

FOREIGN PATENT DOCUMENTS

| DE | 102004004584 A1 | 8/2005 |
| JP | 2001-267520 A | 9/2001 |

(Continued)

OTHER PUBLICATIONS

International Search Report and Written Opinion of PCT Application No. PCT/JP2019/004769, dated Apr. 16, 2019, 09 pages of ISRWO.

*Primary Examiner* — Thanhha S Pham
(74) *Attorney, Agent, or Firm* — Chip Law Group

(57) ABSTRACT

A semiconductor storage device and an electronic device that include a ferroelectric capacitor having a more optimized structure, as a memory cell are provided. A semiconductor storage device includes a field-effect transistor provided in an active region of a semiconductor substrate, a ferroelectric capacitor including a first capacitor electrode and a second capacitor electrode sandwiching a ferroelectric film, the first capacitor electrode being electrically connected to one of a source or a drain of the field-effect transistor, a source line electrically connected to the second capacitor electrode of the ferroelectric capacitor, and a bit line electrically connected to another one of the source or the drain of the field-effect transistor, in which a gate electrode of the field-effect transistor extends in a first direction across (Continued)

the active region, and the source line and the bit line extend in a second direction orthogonal to the first direction.

12 Claims, 20 Drawing Sheets

(56) References Cited

U.S. PATENT DOCUMENTS

| | | | |
|---|---|---|---|
| 2006/0030110 | A1 | 2/2006 | Kumura et al. |
| 2007/0034920 | A1 | 2/2007 | Nirschl et al. |
| 2011/0062504 | A1 | 3/2011 | Hamamoto |
| 2011/0065275 | A1* | 3/2011 | Kim .................. H01L 21/76895 257/E21.585 |

FOREIGN PATENT DOCUMENTS

| | | |
|---|---|---|
| JP | 2006-019571 A | 1/2006 |
| JP | 2006-049566 A | 2/2006 |
| JP | 2007-520069 A | 7/2007 |
| JP | 2011-066062 A | 3/2011 |
| WO | 2005/074024 A1 | 8/2005 |

* cited by examiner

SEMICONDUCTOR STORAGE DEVICE, MANUFACTURING METHOD OF SEMICONDUCTOR STORAGE DEVICE, AND ELECTRONIC DEVICE

CROSS REFERENCE TO RELATED APPLICATIONS

This application is a U.S. National Phase of International Patent Application No. PCT/JP2019/004769 filed on Feb. 12, 2019, which claims priority benefit of Japanese Patent Application No. JP 2018-040988 filed in the Japan Patent Office on Mar. 7, 2018. Each of the above-referenced applications is hereby incorporated herein by reference in its entirety.

TECHNICAL FIELD

The present disclosure relates to a semiconductor storage device, a manufacturing method of a semiconductor storage device, and an electronic device.

BACKGROUND ART

A complementary metal-oxide semiconductor (CMOS) circuit including an n-type metal-oxide-semiconductor field-effect transistor (nMOSFET) and a p-type MOSFET (pMOSFET) that are provided on the same substrate is known as a circuit that has low power consumption, is operable at high speed, and can easily achieve miniaturization and high integration.

Therefore, the CMOS circuit is used in many large scale integration (LSI) devices. Note that such an LSI device has been recently commercialized as a System on a Chip (SoC) obtained by mounting an analog circuit, a memory, a logic circuit, and the like on one chip.

For example, a static random access memory (static RAM) (SRAM) or the like is used as a memory mounted on an LSI device. In recent years, for reducing cost and power consumption of an LSI device, the use of a dynamic RAM (DRAM), a magnetic RAM (MRAM), a ferroelectric RAM (FeRAM), or the like in place of an SRAM is considered.

Here, an FeRAM refers to a semiconductor storage device that stores information using a direction of residual polarization of a ferroelectric member. For example, a structure of using a ferroelectric capacitor having a stack-type cylindrical shape, as a memory cell is proposed as an example of a structure of an FeRAM.

On the other hand, as a memory that uses a capacitor having a stack-type cylindrical shape, as a memory cell, a DRAM that uses a paraelectric capacitor as described in Patent Document 1 described below is known. For example, Patent Document 1 described below discloses a DRAM in which a paraelectric capacitor is provided inside a contact hole provided on a drain region of a field-effect transistor.

CITATION LIST

Patent Document

Patent Document 1: Japanese Unexamined Patent Application Publication No. 2007-520069

SUMMARY OF THE INVENTION

Problems to be Solved by the Invention

However, the structure disclosed in Patent Document 1 described above is a structure related to a DRAM that uses a paraelectric capacitor. Accordingly, the structure disclosed in Patent Document 1 cannot be applied as-is to an FeRAM that uses a ferroelectric capacitor. Therefore, sufficient optimization of a structure for an FeRAM that uses a ferroelectric capacitor as a memory cell has been demanded.

In view of the foregoing, the present disclosure proposes a semiconductor storage device, a manufacturing method of a semiconductor storage device, and an electronic device that are novel and improved, and include a ferroelectric capacitor having a more optimized structure, as a memory cell.

Solutions to Problems

According to the present disclosure, there is provided a semiconductor storage device including a field-effect transistor provided in an active region of a semiconductor substrate, a ferroelectric capacitor including a first capacitor electrode and a second capacitor electrode sandwiching a ferroelectric film, the first capacitor electrode being electrically connected to one of a source or a drain of the field-effect transistor, a source line electrically connected to the second capacitor electrode of the ferroelectric capacitor, and a bit line electrically connected to another one of the source or the drain of the field-effect transistor, in which a gate electrode of the field-effect transistor extends in a first direction across the active region, and the source line and the bit line extend in a second direction orthogonal to the first direction.

Furthermore, according to the present disclosure, there is provided a manufacturing method of a semiconductor storage device, including forming a field-effect transistor in an active region of a semiconductor substrate in such a manner that a gate electrode of the field-effect transistor extends in a first direction across the active region, forming a ferroelectric capacitor including a first capacitor electrode and a second capacitor electrode sandwiching a ferroelectric film, the first capacitor electrode being electrically connected with one of a source or a drain of the field-effect transistor, and forming a source line electrically connected with the second capacitor electrode of the ferroelectric capacitor, and a bit line electrically connected to another one of the source or the drain of the field-effect transistor in such a manner that the source line and the bit line extend in a second direction orthogonal to the first direction.

Furthermore, according to the present disclosure, there is provided an electronic device including a semiconductor storage device including a field-effect transistor provided in an active region of a semiconductor substrate, a ferroelectric capacitor including a first capacitor electrode and a second capacitor electrode sandwiching a ferroelectric film, the first capacitor electrode being electrically connected to one of a source or a drain of the field-effect transistor, a source line electrically connected to the second capacitor electrode of the ferroelectric capacitor, and a bit line electrically connected to another one of the source or the drain of the field-effect transistor, in which, in the semiconductor storage device, a gate electrode of the field-effect transistor extends in a first direction across the active region, and the source line and the bit line extend in a second direction orthogonal to the first direction.

In the present disclosure, in a semiconductor storage device including a capacitor and a transistor, an extending direction of a word line WL that controls selection or nonselection of the capacitor is orthogonal to an extending direction of a source line SL and a bit line BL that drive the capacitor at the time of readout. Therefore, because the capacitor and the transistor can be efficiently arranged in the semiconductor storage device, an increase in occupying area can be prevented.

Effects of the Invention

As described above, according to the present disclosure, a semiconductor storage device and an electronic device that include a ferroelectric capacitor having a more optimized structure, as a memory cell can be provided.

Note that the above-described effect is not always limitative, and together with the above-described effect or in place of the above-described effect, any of the effects described in this specification, or other effects recognized from this specification may be caused.

MODE FOR CARRYING OUT THE INVENTION

Figure 1:
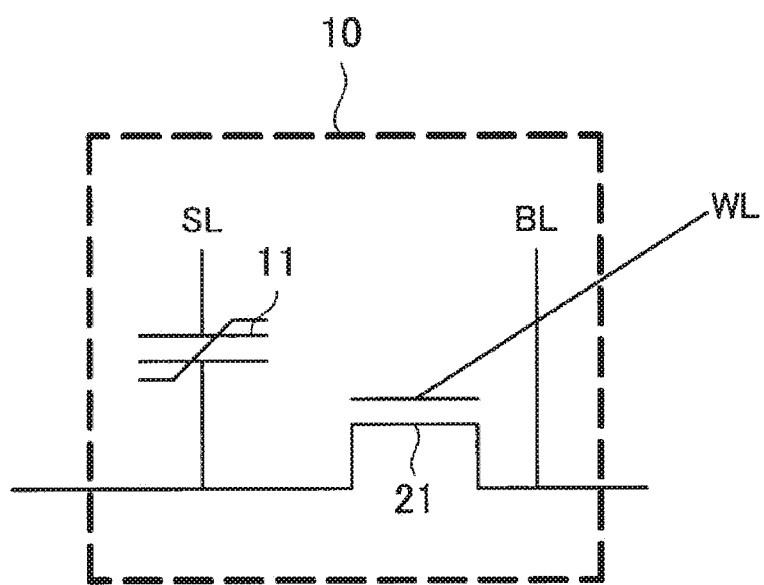
FIG. 1 is a circuit diagram illustrating an equivalent circuit of a semiconductor storage device according to an embodiment of the present disclosure.

Hereinafter, a preferred embodiment of the present disclosure will be described in detail with reference to the attached drawings. Note that, in this specification and the drawings, the redundant description will be omitted by allocating the same reference numerals to the components having substantially the same functional configuration.

Note that the description will be given in the following order.

1. Overview
2. Structure Example
3. Manufacturing Method
3.1. First Manufacturing Method
3.2. Second Manufacturing Method
3.3. Third Manufacturing Method
4. Operation Example
5. Application Example 1. Overview First of all, an overview of a semiconductor storage device according to an embodiment of the present disclosure will be described with reference to FIG. 1. FIG. 1 is a circuit diagram illustrating an equivalent circuit of a semiconductor storage device according to the present embodiment. Note that, in the following description, a "gate" indicates a gate electrode of a field-effect transistor, a "drain" indicates a drain electrode or a drain region of a field-effect transistor, and a "source" indicates a source electrode or a source region of a field-effect transistor.

As illustrated in FIG. 1, a semiconductor storage device 10 includes a capacitor 11 in which information is stored, and a transistor 21 that controls the selection and nonselection of the capacitor 11. The semiconductor storage device 10 is one memory cell storing one-bit information as 0 or 1, for example.

The capacitor 11 is a ferroelectric capacitor including a pair of electrodes sandwiching a ferroelectric film. The capacitor 11 can store information on the basis of a direction of residual polarization of the ferroelectric film sandwiched by the pair of electrodes. In the capacitor 11, one of the pair of electrodes electrically connects with a source line SL, and the other one of the pair of electrodes electrically connects with a source or a drain of the transistor 21.

The transistor 21 is a field-effect transistor that controls the selection and nonselection of the capacitor 11. In the transistor 21, one of the source or the drain electrically connects with the other electrode of the capacitor 11, and the other one of the source or the drain electrically connects with a bit line BL. Furthermore, a gate of the transistor 21 electrically connects with a word line WL, and an on/off state of a channel of the transistor 21 is controlled on the basis of an applied voltage from the word line WL.

In such a semiconductor storage device 10, in a case where information is written into the capacitor 11, first of all, by applying a voltage to the word line WL, a channel of the transistor 21 is shifted to an on state. Thereafter, by applying a potential difference corresponding to information to be written, to between the source line SL and the bit line BL, an electrical field is applied to the ferroelectric film of the capacitor 11. Therefore, the semiconductor storage device 10 can control a direction of residual polarization of the ferroelectric film of the capacitor 11 on the basis of an external electrical field, and write information into the capacitor 11.

On the other hand, in the semiconductor storage device 10, in a case where information is read out from the capacitor 11, first of all, by applying a voltage to the word line WL, a channel of the transistor 21 is shifted to the on state. Thereafter, by applying a predetermined potential difference to between the source line SL and the bit line BL, a polarization direction of the ferroelectric film of the capacitor 11 is shifted to a predetermined direction. At this time, depending on the polarization direction of the ferroelectric film before shift, magnitude of current flowing in the capacitor 11 at the time of shift changes. Accordingly, in the semiconductor storage device 10, by measuring the magnitude of current flowing into the capacitor 11, information stored in the capacitor 11 can be read out.

With this arrangement, the semiconductor storage device 10 can operate as a ferroelectric random access memory (FeRAM) that stores information into the capacitor 11.

In the semiconductor storage device 10, the source line SL and the bit line BL are extended in a direction orthogonal to an extending direction of the word line WL. The reason for the extending directions of the source line SL, the bit line BL, and the word line WL will be hereinafter described.

In the semiconductor storage device 10 functioning as an FeRAM that uses a ferroelectric capacitor, information is stored on the basis of the polarization direction of the capacitor 11. Therefore, for reading out information from the capacitor 11, a voltage is applied to between the source line SL and the bit line BL, and polarization of the capacitor 11 is converted into a charge amount and read out to the outside.

For example, in a case where a voltage is applied to the word line WL, all of the transistors 21 arrayed in the extending direction of the word line WL become the on state. Accordingly, in a case where the extending direction of the word line WL is parallel to any of the source line SL or the bit line BL, a potential is applied from the source line SL or the bit line BL to all the capacitors 11 arrayed in the extending direction of the word line WL, via the transistors 21 being in the on state. In such a case, in the unselected capacitor 11 to which a potential is applied from the source line SL or the bit line BL, a malfunction can possibly be generated.

Furthermore, in the semiconductor storage device 10, for writing information into each of the capacitors 11 arranged in a matrix, the word line WL needs to be orthogonal to the source line SL and the bit line BL, and an intersection point needs to be uniquely defined. Specifically, it is important that the extending direction of the word line WL that controls the selection or nonselection of the capacitor 11 is orthogonal to the extending direction of the source line SL and the bit line BL that drive the capacitor 11 in writing.

Here, as other examples of a semiconductor storage device that stores information using a capacitor include a dynamic random access memory (DRAM) that uses a paraelectric capacitor.

In the DRAM, for increasing an integration degree, a method of fixing a source line connected to one of a pair of electrodes of a capacitor, to a predetermined potential can be used (the method will also be referred to as a "Vcc/2 method"). In such a case, because the source line fixed to the predetermined potential is provided as a plate electrode spreading like a plate over memory cells, an extending direction of the source line is not defined. Accordingly, in the DRAM, an extending direction of a word line that controls the selection or nonselection of a capacitor, and an extending direction of a source line and a bit line that drive the capacitor in reading has not been sufficiently considered.

Because the semiconductor storage device 10 according to the present embodiment is provided as an FeRAM having a drive principle different from that of a DRAM, as described above, it becomes important to define the respective extending directions of the word line WL, the source line SL, and the bit line BL. With this arrangement, because the semiconductor storage device 10 can form a memory cell using a simple configuration including the capacitor 11 and the transistor 21, integration and high density of the semiconductor storage device 10 can be realized more easily. Furthermore, in the semiconductor storage device 10, because selection and nonselection of the capacitor 11 can be controlled by the transistor 21, it is possible to prevent the generation of Write Disturb in which information stored in the unselected capacitor 11 is rewritten in writing of information.

2. Structure Example

Figure 2:
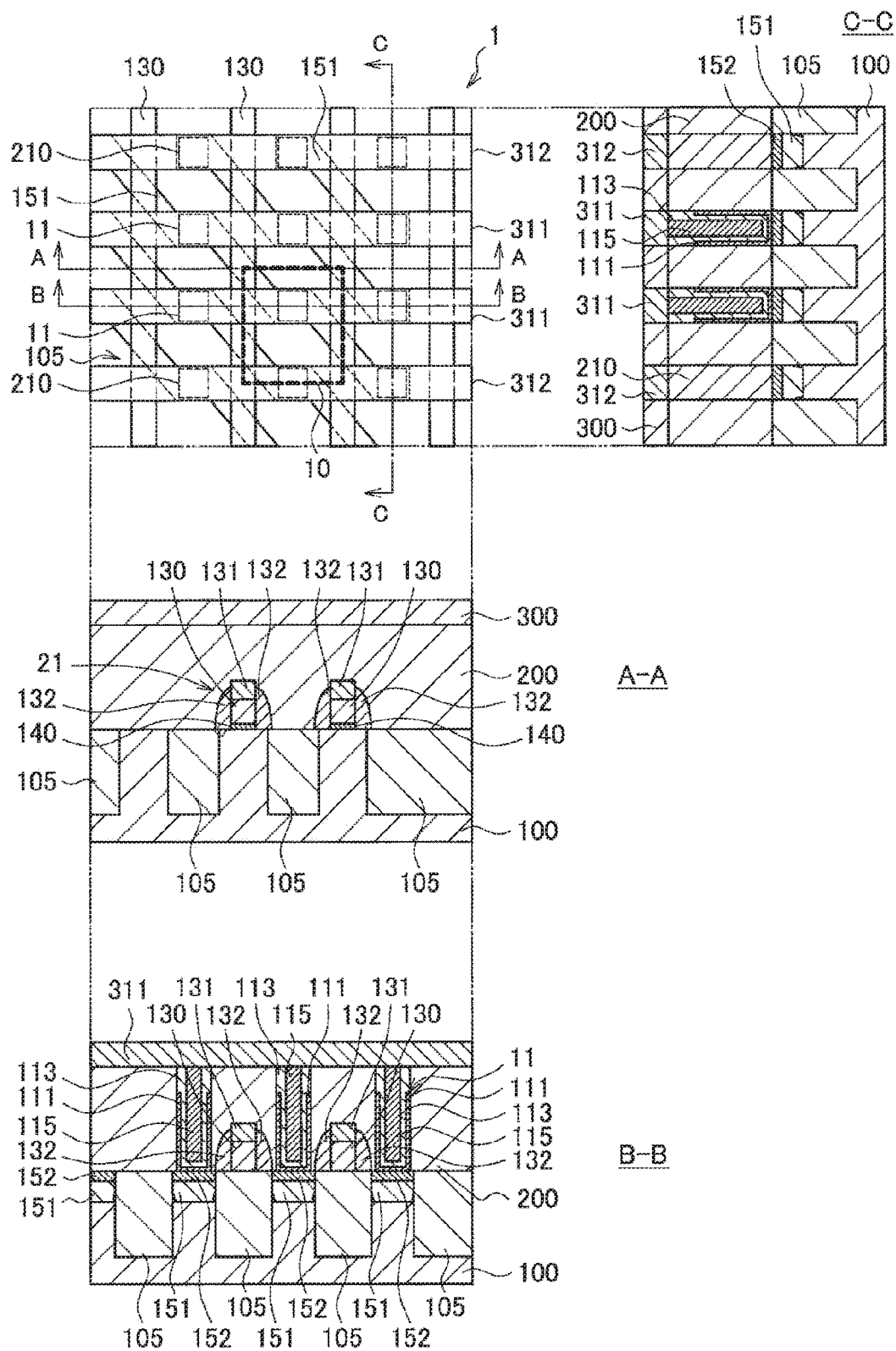
FIG. 2 is a schematic diagram illustrating a planar structure and a cross-sectional structure of the semiconductor storage device.

Subsequently, a specific structure of the semiconductor storage device 10 according to the present embodiment will be described with reference to FIG. 2. FIG. 2 is a schematic diagram illustrating a planar structure and a cross-sectional structure of the semiconductor storage device 10 according to the present embodiment.

Note that, for clarifying the arrangement of each configuration, the plan view in FIG. 2 is described as a planar perspective view while omitting a planarization film 200 and an interlayer insulating film 300 that are formed over the entire surface of a semiconductor substrate 100. Cross-sectional views in FIG. 2 illustrate the respective cross-sections obtained by cutting the plan view along an A-A line, a B-B line, and a C-C line.

Furthermore, in the following description, a "first conductivity type" indicates one of a "p-type" or an "n-type", and a "second conductivity type" indicates the other one of the "p-type" or the "n-type" that is different from the "first conductivity type".

As illustrated in FIG. 2, the semiconductor storage device 10 is provided on the semiconductor substrate 100. By arranging a large number of semiconductor storage devices 10 in a matrix on the semiconductor substrate 100, a semiconductor memory 1 that can store large-volume information is formed.

The capacitor 11 includes a first capacitor electrode 111 provided on a source or drain region 151 along an inner side of an opening penetrating through the planarization film 200, a ferroelectric film 113 provided on the first capacitor electrode 111 along the opening, and a second capacitor electrode 115 provided on the ferroelectric film 113 to fill the opening. The first capacitor electrode 111 electrically connects with the source or drain region 151 of the transistor 21, and the second capacitor electrode 115 electrically connects with a first wiring layer 311 functioning as the source line SL.

The transistor 21 includes a gate insulating film 140 provided on the semiconductor substrate 100, a gate electrode 130 provided on the gate insulating film 140, and the source or drain region 151 provided in an active region 150 of the semiconductor substrate 100. By connecting with the first capacitor electrode 111, one of the source or drain region 151 electrically connects with the capacitor 11, and the other one of the source or drain region 151 electrically connects with a second wiring layer 312 functioning as the bit line BL, via a contact 210. By being provided over a plurality of active regions 150 across an element separation layer 105, the gate electrode 130 functions as the word line WL.

In the semiconductor storage device 10, the active region 150 is provided in a belt-like shape extending in a third direction obliquely intersecting with both of a first direction in which the gate electrode 130 extends, and a second direction in which the first wiring layer 311 and the second wiring layer 312 extend. Accordingly, the source or drain region 151 included in the same transistor 21 as the gate electrode 130 and the gate insulating film 140 that are illustrated in the A-A line cross-sectional view is not illustrated in the A-A line cross-sectional view, and one of the source or drain region 151 is illustrated in the B-B line cross-sectional view. Note that a cross-sectional view cut along the active region 150 will be described later with reference to FIG. 19.

Here, a dynamic random access memory (DRAM) having a stack-type cylindrical shape can be given as a structure of forming a capacitor by burying a dielectric member and an electrode into a recess or an opening that is provided in the planarization film 200, the semiconductor substrate 100, or the like. Nevertheless, in the DRAM that stores information on the basis of charges accumulated in the capacitor, for reading out stored information with sufficient accuracy, for example, a capacitor capacitance of about 20 fF is required for a capacitance of 100 fF of a bit line.

For example, in a case where a relative permittivity of a dielectric member used in a capacitor is 25, when a width of a dielectric film is set to 60 nm and a film thickness thereof is set to 5 nm, a depth of a recess or an opening for forming a capacitor with a capacitance of 20 fF becomes about 8 μm. Because it is extremely difficult to process a recess or an opening having such a depth, the recess or the opening has made miniaturization and high integration of a DRAM difficult.

The semiconductor storage device 10 according to the present embodiment functions as an FeRAM that stores information on the basis of residual polarization of a ferroelectric member. Because an operating principle of the FeRAM is different from that of a DRAM, for example, even when a capacitance of a bit line is 100 fF, if residual polarization of a ferroelectric member is about 25 μC/μm$^2$, information readout can be performed with sufficient accuracy. The capacitor 11 that realizes such residual polarization can be formed by using a recess or an opening having a depth of about 400 nm. Accordingly, the semiconductor storage device 10 according to the present embodiment can more easily advance miniaturization and high integration.

Hereinafter, each configuration of the semiconductor storage device 10 will be described in more detail.

The semiconductor substrate 100 includes semiconductor material, and is a substrate on which the capacitor 11 and the transistor 21 are formed. The semiconductor substrate 100 may be a silicon substrate, or may be a silicon on insulator (SOI) substrate in which an insulating film such as SiO$_2$ is buried in a silicon substrate. Alternatively, the semiconductor substrate 100 may be a substrate formed by another elemental semiconductor such as germanium, or a substrate formed by a compound semiconductor such as gallium arsenic (GaAs), gallium nitride (GaN), or silicon carbide (SiC).

The element separation layer 105 includes insulative material, and electrically separates the transistors 21 provided on the semiconductor substrate 100 from each other. The element separation layer 105 can be provided with extending in the third direction (for example, direction heading for the lower right from the upper left when facing FIG. 2) in mutually-separated belt-like regions. Note that the third direction is a direction obliquely intersecting with both of the first direction (for example, an up-down direction when facing FIG. 2) in which the gate electrode 130 extends, and the second direction (for example, a left-right direction when facing FIG. 2) in which the first wiring layer 311 and the second wiring layer 312 extend. For example, the element separation layer 105 may be formed by an insulative oxynitride such as silicon oxide (SiO$_x$), silicon nitride (SiN$_x$), or silicon oxynitride (SiON).

For example, using a shallow trench isolation (STI) method, the element separation layer 105 may be formed by removing a part of the semiconductor substrate 100 in a predetermined region by etching or the like, and then, filling an opening formed by etching or the like with silicon oxide (SiO$_x$). Furthermore, using a local oxidation of silicon (LOCOS) method, the element separation layer 105 may be formed by thermally-oxidizing the semiconductor substrate 100 in a predetermined region.

The regions having a belt-like shape and being separated from each other by the element separation layer 105 each function as the active region 150 in which the transistor 21 is formed. In the semiconductor substrate 100 in the active region 150, for example, a first conductivity type impure substance (for example, a p-type impure substance such as boron (B) or aluminum (Al)) may be introduced.

The element separation layer 105 and the active region 150 can be provided in a belt-like shape extending in a zigzag shape in the third direction as illustrated in FIG. 2. With this arrangement, because the capacitor 11 and the transistor 21 can be efficiently arranged in the semiconductor storage device 10, an increase in occupying area of the semiconductor storage device 10 can be prevented. Nevertheless, it should be appreciated that the element separation layer 105 and the active region 150 may be provided in a linear shape extending in the third direction without being bent.

The gate insulating film 140 includes insulative material, and is provided on the active region 150 of the semiconductor substrate 100. The gate insulating film 140 may be formed by insulative material known as a gate insulating film of a field-effect transistor. For example, the gate insulating film 140 may be formed by an insulative oxynitride such as silicon oxide (SiO$_x$), silicon nitride (SiN$_x$), or silicon oxynitride (SiON).

The gate electrode 130 includes conductive material, and is provided on the gate insulating film 140. Specifically, the gate electrode 130 is provided with extending in the first direction obliquely intersecting with the third direction in which the element separation layer 105 extends. Furthermore, a plurality of gate electrodes 130 is provided at predetermined intervals in the second direction orthogonal to the first direction. By extending across the element separation layer 105 and being provided over the plurality of active regions 150, the gate electrode 130 functions as the word line WL that electrically connects gate electrodes of the transistors 21 of the respective memory cells.

For example, the gate electrode 130 may be formed by polysilicon or the like, or may be formed by metal, an alloy, a metal compound, or an alloy (so-called silicide) of metal (Ni, etc.) and polysilicon. Specifically, the gate electrode 130 may be formed in a stacked structure of a metal layer and a polysilicon layer. For example, the gate electrode 130 may be formed in a stacked structure of a metal layer including TiN or TaN that is provided on the gate insulating film 140, and a polysilicon layer. According to such a stacked structure, the gate electrode 130 can reduce interconnection resistance as compared with a case where the gate electrode 130 is formed only by a polysilicon layer.

The source or drain region 151 is a region of a second conductivity type that is formed in the semiconductor substrate 100. Specifically, the source or drain regions 151 may be respectively provided in the active regions 150 extending in the third direction, so as to sandwich the gate electrodes 130. One of the source or drain region 151 electrically connects with the first capacitor electrode 111, and the other one of the source or drain region 151 electrically connects with the second wiring layer 312 functioning as the bit line BL, via the contact 210.

For example, the source or drain region 151 may be formed by introducing a second conductivity type impure substance (for example, an n-type impure substance such as phosphorus (P) or arsenic (As)) into the semiconductor substrate 100 in the active region 150. Note that a lightly-doped drain (LDD) region having the same second conductivity type as the source or drain region 151, and having a lower density of a conductive impure substance than the source or drain region 151 may be formed in the semiconductor substrate 100 between the source or drain region 151 and the gate electrode 130.

Note that whichever of the source or drain regions 151 provided across the gate electrode 130 may function as a source region, and whichever thereof may function as a drain region. The functions can be arbitrarily changed depending on the polarity of a conductive impure substance or a connected wire.

A side wall insulating film 132 includes insulative material, and is provided on a side surface of the gate electrode 130 as a side wall. Specifically, the side wall insulating film 132 can be formed by uniformly forming an insulating film in a region including the gate electrode 130, and performing vertical anisotropic etching of the insulating film. For example, the side wall insulating film 132 may be formed by a single layer or a plurality of layers by an insulative oxynitride such as silicon oxide ($SiO_x$), silicon nitride ($SiN_x$), or silicon oxynitride (SiON).

When introducing a second conductivity type impure substance into the semiconductor substrate 100, by shielding the second conductivity type impure substance, the side wall insulating film 132 controls a positional relationship between the gate electrode 130 and the source or drain region 151, in a self-aligning manner. Because the side wall insulating film 132 can gradually control the introduction of a conductive impure substance into the semiconductor substrate 100, it becomes possible to form, in a self-aligning manner, the above-described LDD region between the source or drain region 151 and the gate electrode 130.

A conductive layer 131 is provided on the gate electrode 130, and functions as a wire that electrically connects the gate electrode 130. Specifically, the conductive layer 131 provided on the upper surface of the gate electrode 130, and functions as the word line WL. For example, the conductive layer 131 may be formed by metal or a metal compound.

A contact region 152 is provided on the surface of the semiconductor substrate 100 in the source or drain region 151, and reduces contact resistance between the source or drain region 151 and the first capacitor electrode 111 or the contact 210. Specifically, the contact region 152 may be formed by a metal such as Ni, or an alloy (so-called silicide) with silicon.

The planarization film 200 includes insulative material, buries the transistor 21, and is provided over the entire surface of the semiconductor substrate 100. The planarization film 200 is provided with an opening for exposing one of the source or drain region 151 of the transistor 21, and the capacitor 11 having a cylindrical structure is provided inside the opening. For example, the planarization film 200 may be formed by an insulative oxynitride such as silicon oxide ($SiO_x$), silicon nitride ($SiN_x$), or silicon oxynitride (SiON).

Note that a linear layer, which is not illustrated in FIG. 2 and includes insulative material, may be provided over the entire surface on the semiconductor substrate 100, the side wall insulating film 132, and the conductive layer 131. In a process of forming an opening for providing the capacitor 11 or the contact 210 in the planarization film 200, the linear layer can provide high etching selectivity between the linear layer and the planarization film 200. Therefore, in the process, the linear layer can prevent the progress of etching in the semiconductor substrate 100. For example, the linear layer may be formed by an insulative oxynitride such as silicon oxide ($SiO_x$), silicon nitride ($SiN_x$), or silicon oxynitride (SiON). Specifically, in a case where the planarization film 200 is formed by silicon oxide ($SiO_x$), the linear layer may be formed by silicon nitride ($SiN_x$).

Furthermore, the linear layer may be formed as a layer that adds compression stress or tensile stress to the semiconductor substrate 100 under the gate insulating film 140. In such a case, the linear layer can increase a carrier mobility of a channel formed in the semiconductor substrate 100, by a stress effect.

The first capacitor electrode 111 includes conductive material, and is provided along an inner side of an opening formed in the planarization film 200 so as to expose the active region 150. The opening formed in the planarization film 200 is provided so as to expose one of the source or drain region 151, and the first capacitor electrode 111 is provided on one of the source or drain region 151 that is exposed through the opening. Therefore, the first capacitor electrode 111 can electrically connect with the source or drain region 151. Furthermore, the first capacitor electrode 111 is provided with being recessed from an opening surface of the opening provided in the planarization film 200. With this arrangement, it is possible to prevent the first capacitor electrode 111 from short-circuiting with the second capacitor electrode 115 or the first wiring layer 311, while securing a capacitance of the capacitor 11.

For example, the first capacitor electrode 111 may be formed by metal such as titanium (Ti) or tungsten (W), or a metal compound such as titanium nitride (TiN) or tantalum nitride (TaN). Furthermore, the first capacitor electrode 111 may be formed by ruthenium (Ru), ruthenium oxide ($RuO_2$), or the like. The first capacitor electrode 111 can be formed using, for example, sputtering that is based on atomic layer deposition (ALD), chemical vapor deposition (CVD), or ionized metal plasma (IMP).

The ferroelectric film 113 includes ferroelectric material, and is provided on the first capacitor electrode 111 along the inner side of the opening formed in the planarization film 200. The ferroelectric film 113 is formed by ferroelectric material that autonomously polarizes and can control a direction of residual polarization on the basis of an external electrical field. For example, the ferroelectric film 113 may be formed by ferroelectric material having a perovskite structure such as piezoelectric zirconate titanate (Pb(Zr,Ti)$O_3$: PZT) or strontium bismuth tantalate ($SrBi_2Ta_2O_9$: SBT). Furthermore, the ferroelectric film 113 may be a ferroelectric film obtained by transubstantiating a film including high dielectric material such as $HfO_x$, $ZrO_x$, or $HfZrO_x$, by thermal treatment or the like, or may be a ferroelectric film obtained by transubstantiating the above-described film including high dielectric material by introducing atom such as lanthanum (La), silicon (Si), or gadolinium (Gd). Moreover, the ferroelectric film 113 may be formed by a single layer or may be formed by a plurality of layers. For example, the ferroelectric film 113 may be a single layer film including ferroelectric material such as $HfO_x$. The ferroelectric film 113 can be formed by using atomic layer deposition (ALD), chemical vapor deposition (CVD), or the like.

The second capacitor electrode 115 includes conductive material, and is provided on the ferroelectric film 113 so as to fill the opening formed in the planarization film 200. For example, the second capacitor electrode 115 may be formed by metal such as titanium (Ti) or tungsten (W), or a metal compound such as titanium nitride (TiN) or tantalum nitride (TaN). Furthermore, the second capacitor electrode 115 may be formed by ruthenium (Ru), ruthenium oxide ($RuO_2$), or the like. The second capacitor electrode 115 can be formed by using atomic layer deposition (ALD), chemical vapor deposition (CVD), or the like.

The capacitor 11 is formed by the above-described ferroelectric film 113 being sandwiched between the first capacitor electrode 111 and the second capacitor electrode 115. Therefore, the semiconductor storage device 10 can store information on the basis of a polarization direction of the ferroelectric film 113 of the capacitor 11.

The contact 210 includes conductive material, and is provided with penetrating through the planarization film 200. Specifically, the contact 210 is provided on the active region 150 corresponding to the other one of the source or drain region 151, and electrically connects the other one of the source or drain region 151 of the transistor 21, and the second wiring layer 312 functioning as the bit line BL.

For example, the contact 210 may be formed by metal such as titanium (Ti) or tungsten (W), or a metal compound such as titanium nitride (TiN) or tantalum nitride (TaN). The contact 210 may be formed by a single layer or may be formed by a stacked member including a plurality of layers. For example, the contact 210 may be formed by a stacked member of Ti or TiN and W.

The interlayer insulating film 300 buries the first wiring layer 311 and the second wiring layer 312, and is provided on the planarization film 200 over the entire surface of the semiconductor substrate 100. For example, the interlayer insulating film 300 may be formed by an insulative oxynitride such as silicon oxide ($SiO_x$), silicon nitride ($SiN_x$), or silicon oxynitride (SiON).

The first wiring layer 311 includes conductive material, and is provided on the planarization film 200. Specifically, the first wiring layer 311 is provided on the capacitor 11 as a wire extended in the second direction orthogonal to the first direction in which the word line WL extends. By electrically connecting with the second capacitor electrode 115, the first wiring layer 311 functions as the source line SL. The first wiring layer 311 may be formed by metal material such as copper (Cu) or aluminum (Al), for example, or may be formed in a damascene structure or a dual damascene structure of Cu.

The second wiring layer 312 includes conductive material, and is provided on the planarization film 200. Specifically, the second wiring layer 312 is provided on the contact 210 as a wire extended in the second direction orthogonal to the first direction in which the word line WL extends. By electrically connecting with the other one of the source or drain region 151, via the contact 210, the second wiring layer 312 functions as the bit line BL. The second wiring layer 312 may be formed by metal material such as copper (Cu) or aluminum (Al), for example, or may be formed in a damascene structure or dual damascene structure of Cu.

According to the above-described structure, in the semiconductor storage device 10, because the selection and nonselection of the capacitor 11 can be controlled by the transistor 21, the generation of Write Disturb in the unselected capacitor 11 can be prevented. Furthermore, in the semiconductor storage device 10, by defining the respective extending directions of the active region 150, the word line WL, the source line SL, and the bit line BL, it is possible to efficiently arrange the transistor 21 and the capacitor 11. With this arrangement, in the semiconductor storage device 10, because an increase in occupying area of one memory cell can be suppressed, it becomes possible to further increase storage density.

3. Manufacturing Method (3.1. First Manufacturing Method)

Subsequently, a first manufacturing method of the semiconductor storage device 10 according to the present embodiment will be described with reference to FIGS. 3 to 9. FIGS. 3 to 9 illustrate plan views and cross-sectional views describing the respective processes of the first manufacturing method of the semiconductor storage device 10.

Note that, also in FIGS. 3 to 9, similarly to FIG. 2, the illustration of layers formed over the entire surface of the semiconductor substrate 100 is omitted. Furthermore, cross-sectional views illustrate the respective cross-sections obtained by cutting the plan views along an AA line, a BB line, and a CC line.

Figure 3:
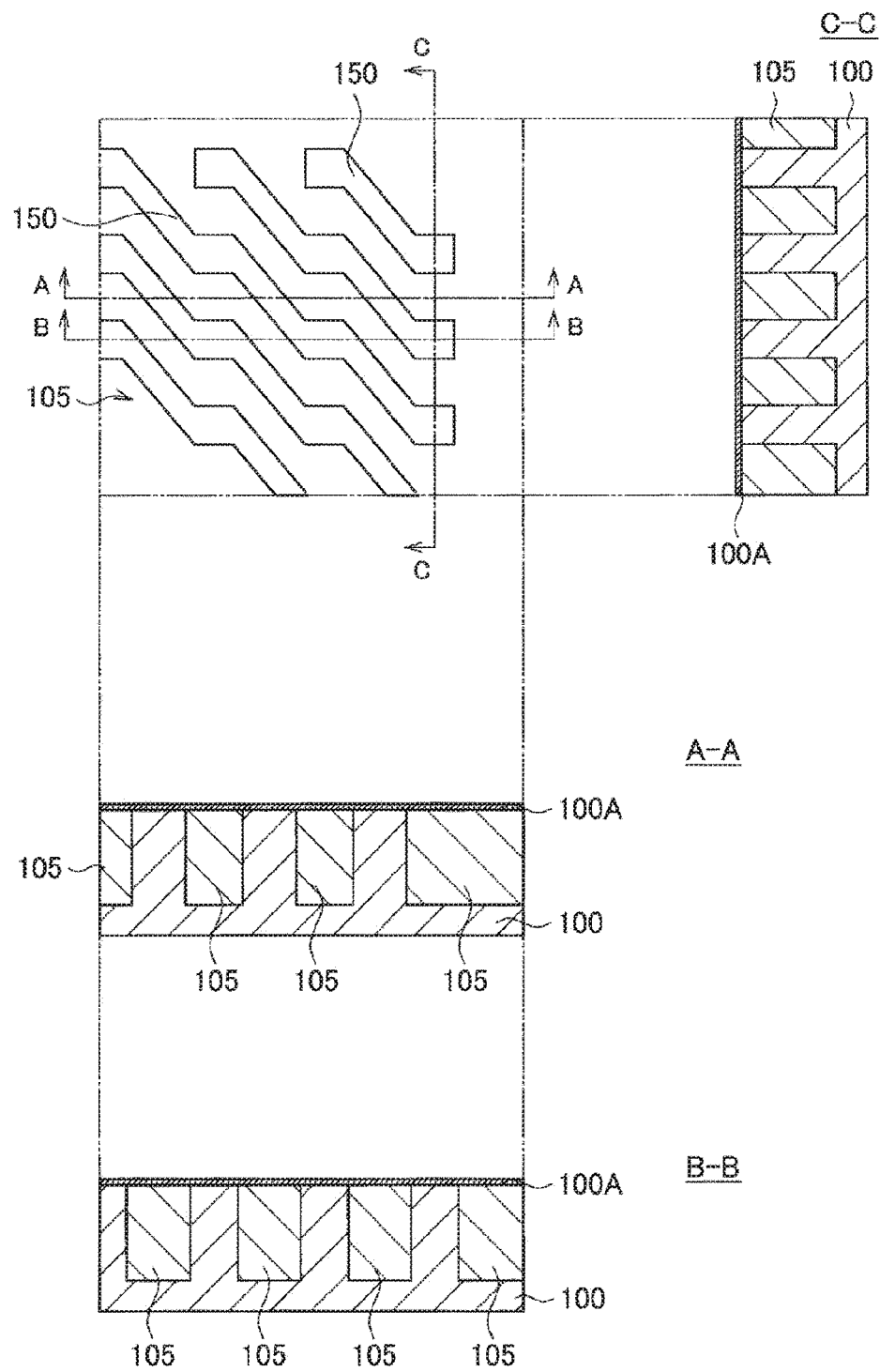
FIG. 3 illustrates a plan view and a cross-sectional view describing one process of a first manufacturing method of the semiconductor storage device.

First of all, as illustrated in FIG. 3, the element separation layer 105 is formed on the semiconductor substrate 100, and the active region 150 in which the transistor 21 is formed is formed.

Specifically, a $SiO_2$ film is formed by dry oxidation or the like on the semiconductor substrate 100 including Si, and a $Si_3N_4$ film is further formed by low-pressure chemical vapor deposition (CVD) or the like. Subsequently, after a resist layer patterned so as to protect a region in which the active region 150 is formed on the $Si_3N_4$ film, the $SiO_2$ film, the $Si_3N_4$ film, and the semiconductor substrate 100 are etched in the depth of 350 nm to 400 nm. Next, by forming a $SiO_2$ film with a film thickness of 650 nm to 700 nm, and filling an opening formed by etching, the element separation layer 105 is formed. For example, high-density plasma CVD that has good unevenness coatability and can form a precise $SiO_2$ film may be used for the formation of the $SiO_2$ film.

Subsequently, by removing the excessively-formed $SiO_2$ film using chemical mechanical polish (CMP) or the like, the surface of the semiconductor substrate 100 is planarized. The removal of the SiO$_2$ film using CMP is only required to be performed until a Si$_3$N$_4$ film is exposed, for example.

Moreover, the Si$_3$N$_4$ film is removed using hot phosphoric acid or the like. Note that, for making the SiO$_2$ film of the element separation layer 105 a more precise film, or for rounding the corner of the active region 150, the semiconductor substrate 100 can be annealed under N$_2$, O$_2$, or H$_2$/O$_2$ environment before the Si$_3$N$_4$ film is removed. Next, by forming an oxidized film 100A by oxidizing the surface of a region of the semiconductor substrate 100 that corresponds to the active region 150, by about 10 nm, and then, performing ion implantation of the first conductivity type impure substance (for example, boron (B) and the like), the semiconductor substrate 100 in the active region 150 is converted into a first conductivity type well.

Figure 4:
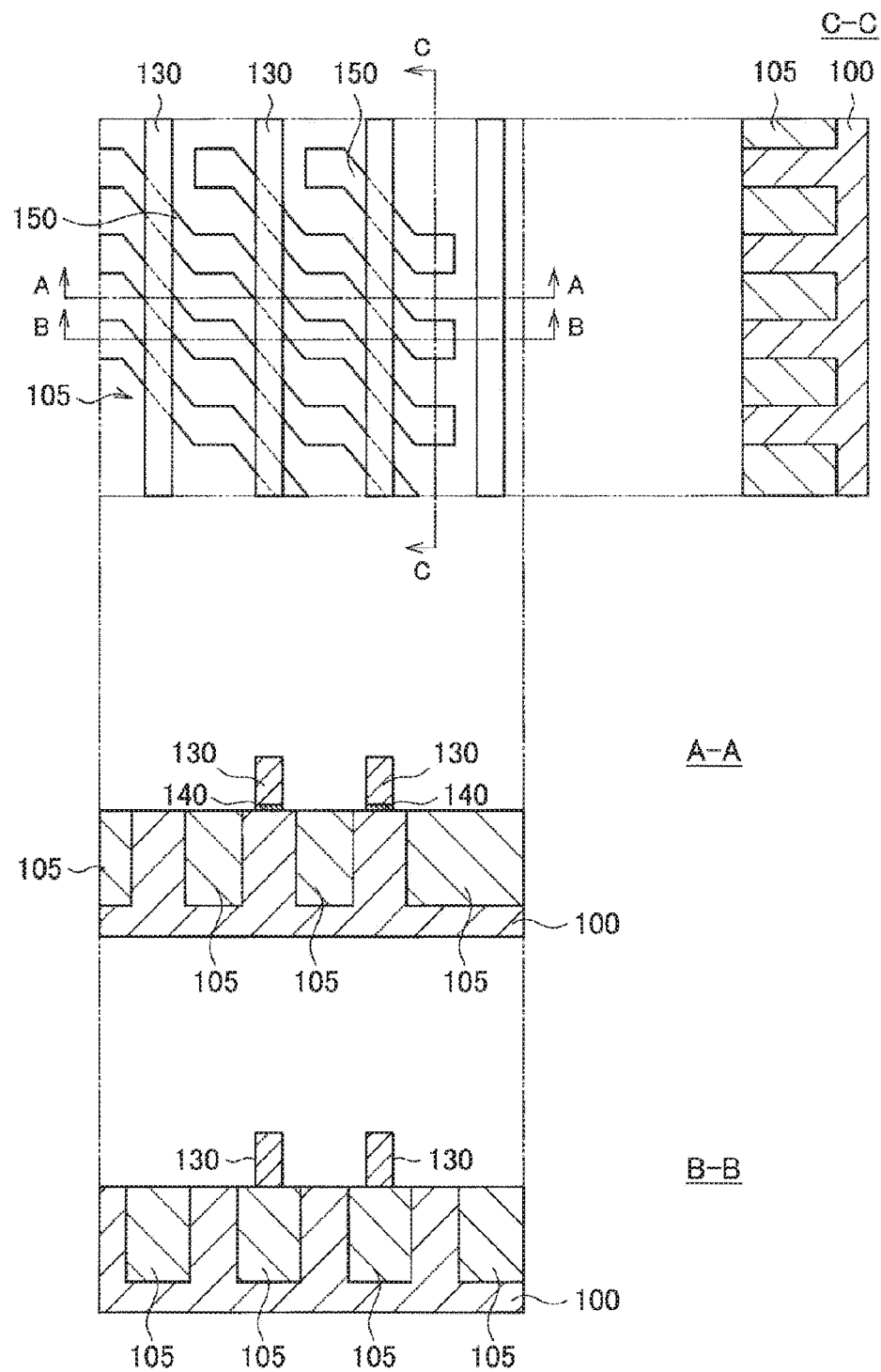
FIG. 4 illustrates a plan view and a cross-sectional view describing one process of the first manufacturing method of the semiconductor storage device.

Next, as illustrated in FIG. 4, after the gate insulating film 140 is formed, the gate electrode 130 is formed on the gate insulating film 140.

Specifically, first of all, the oxidized film 100A covering the surface of the semiconductor substrate 100 is peeled using hydrofluoric acid solution or the like. Thereafter, by dry oxidation that uses O$_2$ at 700° C. or rapid thermal anneal (RTA) processing, the gate insulating film 140 including SiO$_2$ is formed on the semiconductor substrate 100 with a film thickness of 1.5 nm to 10 nm. Note that, as gas used in dry oxidation, aside from O$_2$, mixed gas of H$_2$/O$_2$, N$_2$O, or NO may be used. Furthermore, when the gate insulating film 140 is formed, by using plasma nitridation, nitrogen doping can also be performed into the SiO$_2$ film.

Next, using low-pressure CVD in which SiH$_4$ gas is used as material gas and a film formation temperature is set to 580° C. to 620° C., a polysilicon film is formed with a film thickness of 50 nm to 150 nm. Thereafter, by performing anisotropic etching on the formed polysilicon film using a patterned resist as a mask, the gate electrode 130 is formed. For example, HBr or Cl-based gas can also be used for anisotropic etching. For example, at a 40-nm node, the gate electrode 130 may be formed by setting a gate width to about 40 nm to 50 nm.

Note that the gate electrode 130 functions as the word line WL. Furthermore, the gate electrode 130 may be formed simultaneously with or in a shared manner with a gate electrode of a transistor provided in a logic region or the like that is other than a region in which the semiconductor storage device 10 is formed.

Figure 5:
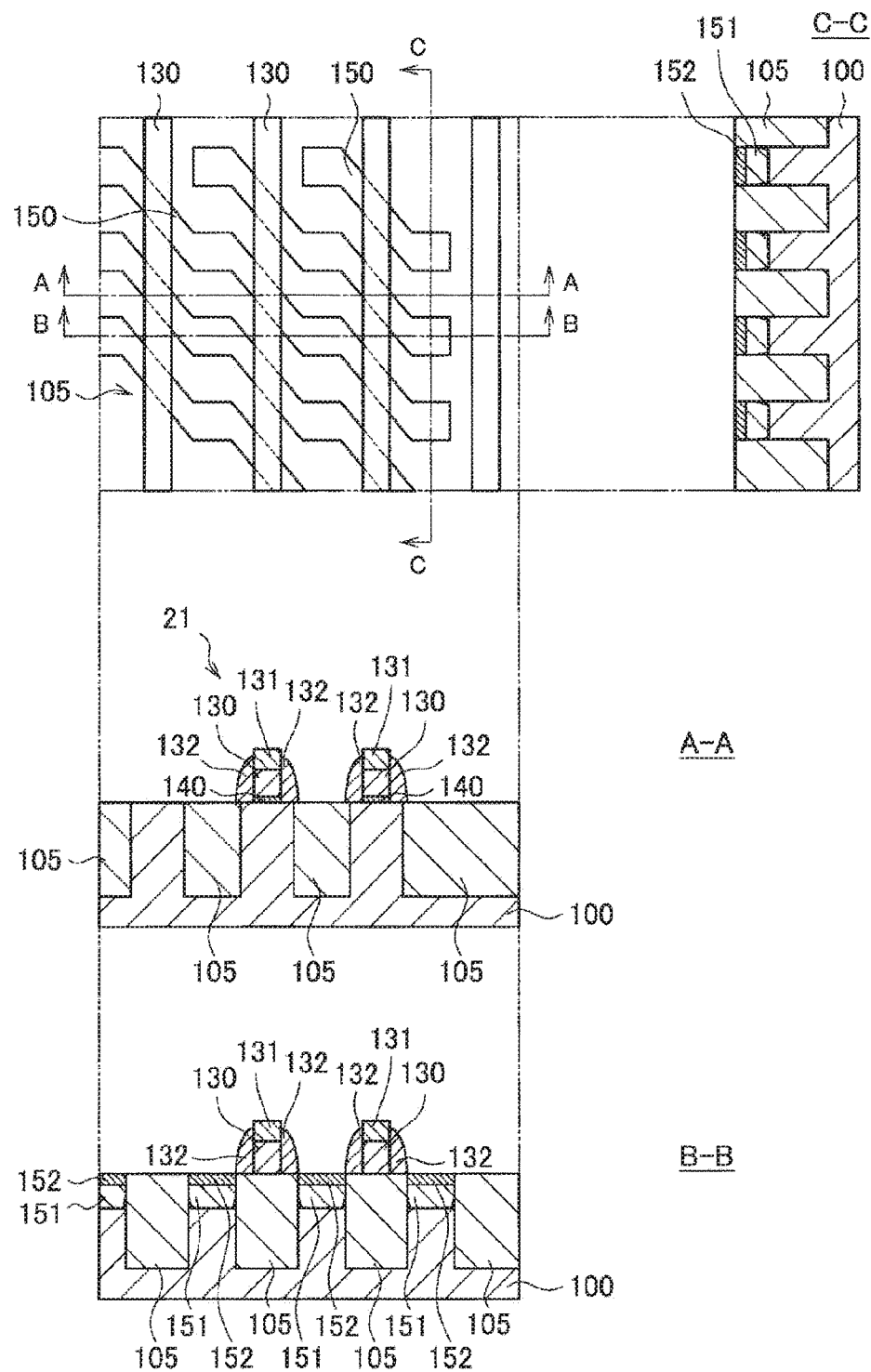
FIG. 5 illustrates a plan view and a cross-sectional view describing one process of the first manufacturing method of the semiconductor storage device.

Next, as illustrated in FIG. 5, the side wall insulating films 132 are formed on both side surfaces of the gate electrode 130, and the source or drain region 151 is formed in the active region 150 of the semiconductor substrate 100.

Specifically, by performing ion implantation of arsenic (As) being the second conductivity type impure substance, at 5 keV to 20 keV and at the density of 5 to 20×10$^{13}$/cm$^2$, to both sides of the gate electrode 130, an LDD region is formed. Because a short channel effect can be suppressed by forming the LDD, it is possible to suppress a characteristic variation of the transistor 21. Note that phosphorus (P) can also be used as the second conductivity type impure substance.

Next, after a SiO$_2$ film with a film thickness of 10 nm to 30 nm is formed using plasma CVD, a Si$_3$N$_4$ film with a film thickness of 30 nm to 50 nm is formed using the plasma CVD, and an insulating film for side wall is formed. Thereafter, by performing anisotropic etching on the insulating film for side wall, the side wall insulating films 132 are formed on the both side surfaces of the gate electrode 130.

Thereafter, ion implantation of arsenic (As) being the second conductivity type impure substance is performed at 20 keV to 50 keV and at the density of 1 to 2×10$^{15}$/cm$^2$, and the second conductivity type impure substance is introduced to the both sides of the gate electrode 130. Therefore, the source or drain regions 151 are formed in the active regions 150 on both sides of the gate electrode 130. Moreover, by performing rapid thermal annealing (RTA) for five seconds at 1000° C., an ion-implanted impure substance is activated. Therefore, the transistor 21 is formed. Note that, for promoting the activation of an introduced impure substance and suppressing the diffusion of the impure substance, it is also possible to activate the impure substance using spike RTA.

Subsequently, by performing RTA for 10 to 60 seconds at 300° C. to 450° C. after a Ni film with a film thickness of 6 nm to 8 nm is formed by sputtering or the like over the entire surface of the semiconductor substrate 100, Ni on Si is silicidized (NiSi). Because Ni on SiO$_2$ remains in an unreacted state, by removing unreacted Ni using H$_2$SO$_4$/H$_2$O$_2$, the conductive layer 131 including NiSi, and the contact region 152 are respectively formed on the gate electrode 130 and in the source or drain region 151. Note that, by forming a Co or NiPt film in place of Ni, the conductive layer 131 and the contact region 152 may be formed by CoSi$_2$ or NiSi. The temperature of RTA in a case where a Co or NiPt film is formed is only required to be appropriately set.

Figure 6:
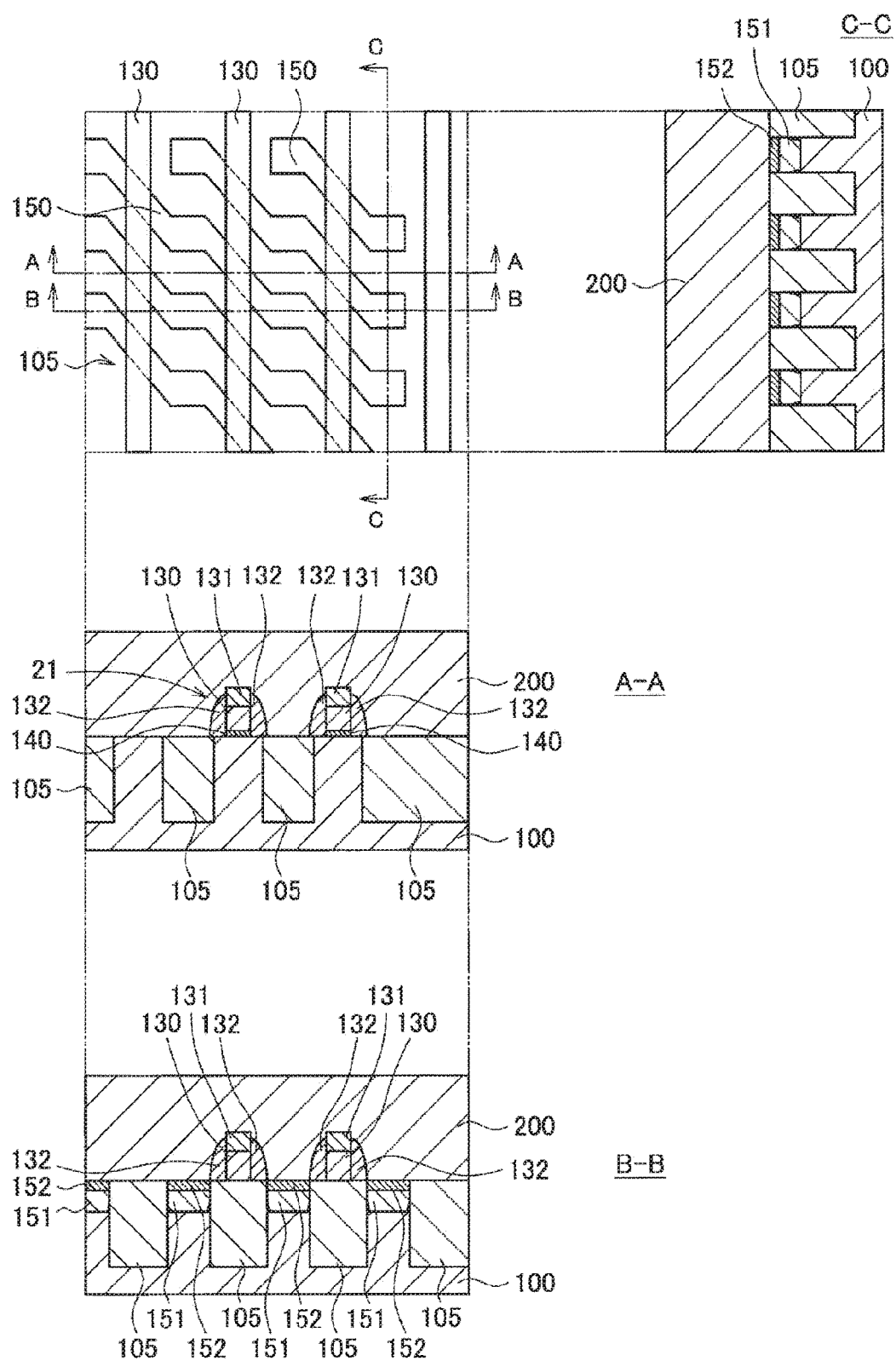
FIG. 6 illustrates a plan view and a cross-sectional view describing one process of the first manufacturing method of the semiconductor storage device.

Subsequently, as illustrated in FIG. 6, the planarization film 200 is formed over the entire surface of the semiconductor substrate 100 so as to bury the transistor 21.

Specifically, by performing planarization using the CMP method after a SiO$_2$ film with a film thickness of 100 nm to 500 nm is formed on the semiconductor substrate 100 using CVD or the like, the planarization film 200 is formed.

Note that, before the planarization film 200 is formed, a linear layer, which is not illustrated and includes SiN, may be formed on the semiconductor substrate 100 over the entire surface of the semiconductor substrate 100. For example, by forming a SiN film with a film thickness of 10 nm to 50 nm using plasma CVD, the linear layer may be formed. The linear layer can also be formed as a layer that adds compression stress or tensile stress to the semiconductor substrate 100. By forming the linear layer, in a subsequent process, the planarization film 200 can be etched under a condition under which etching selectivity between the planarization film 200 and the linear layer becomes high. Thus, etching can be performed with higher controllability.

Figure 7:
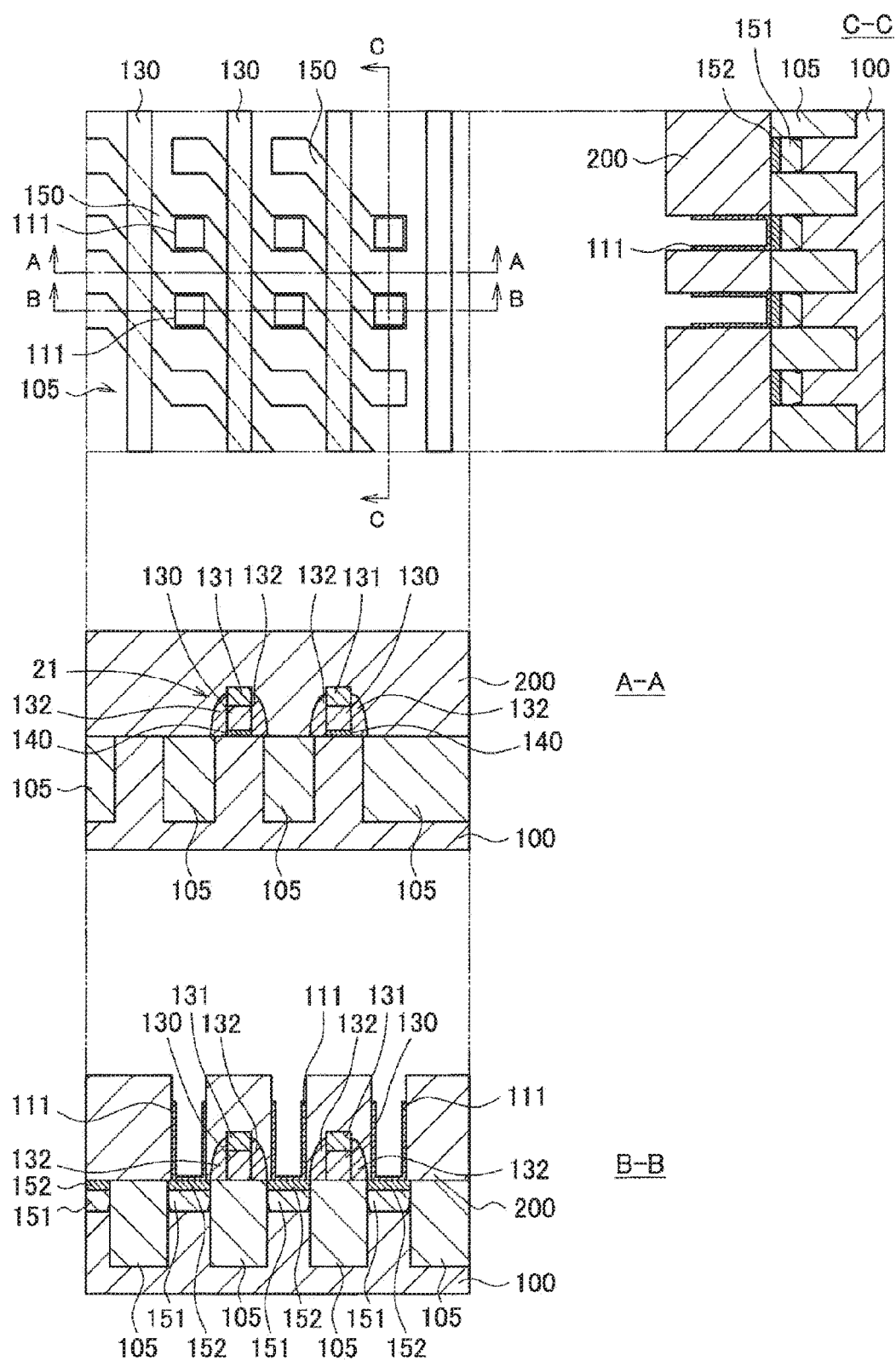
FIG. 7 illustrates a plan view and a cross-sectional view describing one process of the first manufacturing method of the semiconductor storage device.

Subsequently, as illustrated in FIG. 7, after an opening penetrating through the planarization film 200 and exposing the active region 150 is formed, the first capacitor electrode 111 is formed inside the opening.

Specifically, by anisotropic etching that uses a resist patterned by lithography as a mask, an opening is formed in the planarization film 200 on the other one of the source or drain region 151. The opening can be formed with a width of 60 nm and a depth of 200 nm, for example. At this time, if an aspect ratio of the opening is about 20, etching for forming the opening and filling of the opening by the film formation performed subsequently can be performed without problem. The anisotropic etching can be performed by using fluorocarbon-based gas, for example. Furthermore, by using the above-described linear layer, etching can be stopped with good controllability.

Next, using sputtering that is based on ALD, CVD, or IMP, a TiN film with a film thickness of 5 nm to 20 nm is formed on the source or drain region 151 along the internal shape of the opening formed in the planarization film 200.

Note that TaN, Ru, RuO$_2$, or the like can be used in place of TiN as material for forming the first capacitor electrode 111. Thereafter, after a resist is applied onto the formed first capacitor electrode 111, by performing etch-back under a condition under which the resist and the first capacitor electrode 111 become the subequal selectivity, the first capacitor electrode 111 is recessed from an opening surface of the opening. Therefore, it is possible to recess a shoulder portion of the first capacitor electrode 111 and form a recess while leaving the first capacitor electrode 111 on the bottom portion and the side surfaces of the opening.

Figure 8:
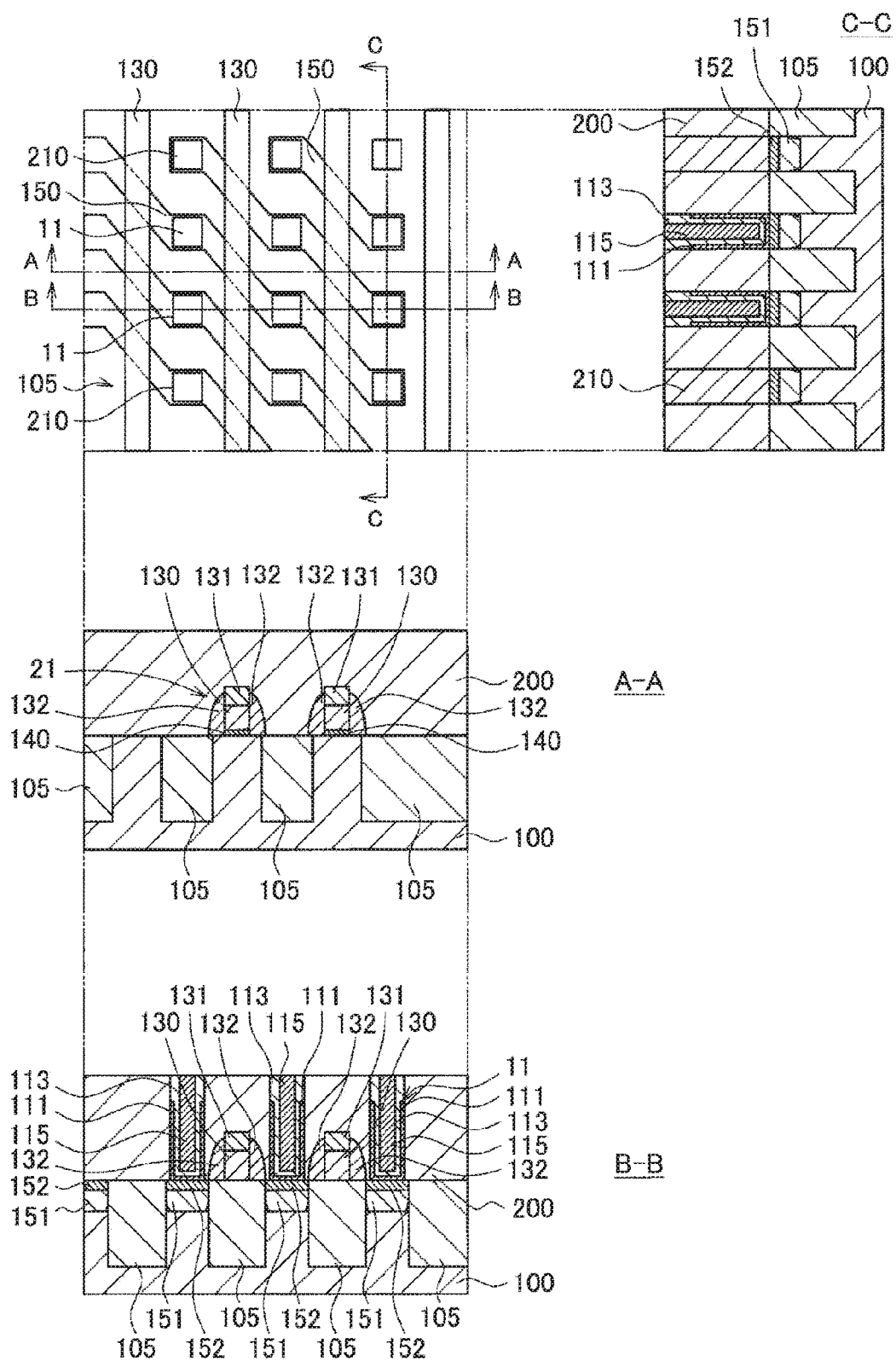
FIG. 8 illustrates a plan view and a cross-sectional view describing one process of the first manufacturing method of the semiconductor storage device.

Next, as illustrated in FIG. 8, by forming the ferroelectric film 113 on the first capacitor electrode 111, and further forming the second capacitor electrode 115 on the ferroelectric film 113, the capacitor 11 is formed inside the opening.

Specifically, a film of hafnium oxide (HfO$_x$) being high dielectric material is formed with a film thickness of 3 nm to 10 nm using CVD or ALD on the first capacitor electrode 111 along the internal shape of the opening provided in the planarization film 200, and the ferroelectric film 113 is formed. Note that, by being subjected to annealing processing in a subsequent process, hafnium oxide (HfO$_x$) being high dielectric material is converted into ferroelectric material.

Note that high dielectric material such as zirconium oxide (ZrO$_x$) or hafnium zirconium oxide (HfZrO$_x$) can also be used in place of hafnium oxide. Furthermore, by doping these types of high dielectric material with lanthanum (La), silicon (Si), gadolinium (Gd), or the like, it is possible to convert these types of high dielectric material into ferroelectric material. Moreover, perovskite ferroelectric material such as piezoelectric zirconate titanate (PZT) or strontium bismuth tantalate (SBT) can also be used as the ferroelectric film 113.

Thereafter, by forming a TiN film with a film thickness of 5 nm to 20 nm on the ferroelectric film 113 using CVD, ALD, sputtering, or the like so as to fill the opening formed in the planarization film 200, the second capacitor electrode 115 is formed. Note that TaN, Ru, or RuO$_2$ can also be used as material for forming the second capacitor electrode 115. Subsequently, crystallization annealing for converting HfO$_x$ included in the ferroelectric film 113 into ferroelectric material is performed. Note that the crystallization annealing for converting HfO$_x$ into ferroelectric material may be performed in this process, or may be performed in another process (for example, after CMP to be described later). The condition of the crystallization annealing can be arbitrarily changed without departing from the range of 400° C. to 700° C. and a heat resistance range of another configuration such as the transistor 21 and NiSi, for example. Thereafter, by performing CMP or whole-surface etch-back, the ferroelectric film 113 and the second capacitor electrode 115 that have been excessively formed on the planarization film 200 are removed. Therefore, the capacitor 11 is formed.

Figure 9:
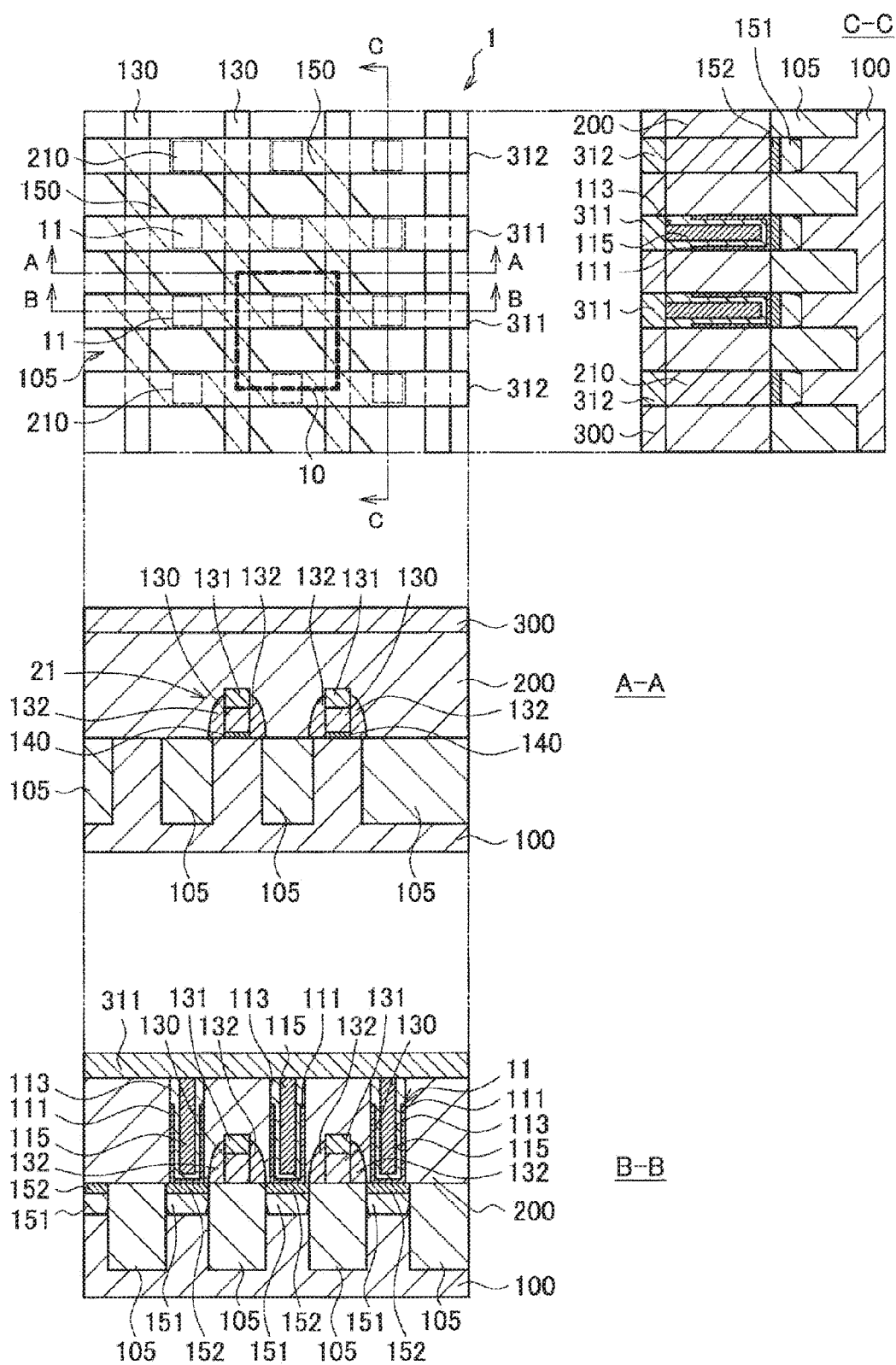
FIG. 9 illustrates a plan view and a cross-sectional view describing one process of the first manufacturing method of the semiconductor storage device.

Next, as illustrated in FIG. 9, after the contact 210 electrically connecting with the other one of the source or drain region 151 is formed, the interlayer insulating film 300 is formed over the entire surface of the semiconductor substrate 100, and the first wiring layer 311 and the second wiring layer 312 are formed.

Specifically, by etching the planarization film 200, an opening is formed on the other one of the source or drain region 151. Subsequently, by performing planarization using the CMP method after forming Ti and TiN films in the opening in the planarization film 200 using CVD or the like, and further forming a W film, the contact 210 is formed on the other one of the source or drain region 151. Note that the Ti and TiN films may be formed using a sputtering method that uses an ion metal plasma (IMP), or the like. Furthermore, planarization may be performed using whole-surface etch-back in place of the CMP method. Note that the contact 210 may be formed simultaneously with a contact of a transistor provided in a logic region or the like that is other than a region in which the semiconductor storage device 10 is formed.

Thereafter, by performing planarization using the CMP method after a SiO$_2$ film with a film thickness of 100 nm to 500 nm is formed using CVD or the like over the entire surface of the planarization film 200, the interlayer insulating film 300 is formed. Subsequently, after an opening for electrically connecting with the second capacitor electrode 115 or the contact 210 is formed by etching the interlayer insulating film 300, by using a damascene structure or a dual damascene structure, the first wiring layer 311 and the second wiring layer 312 are formed using Cu or the like as wiring material. Note that the first wiring layer 311 and the second wiring layer 312 may be formed by Al or the like. The first wiring layer 311 functions as the source line SL by being extended in the second direction on the second capacitor electrode 115. Furthermore, the second wiring layer 312 functions as the bit line BL by being extended in the second direction on the contact 210.

According to the above-described process, the semiconductor storage device 10 according to the present embodiment can be formed.

(3.2. Second Manufacturing Method)

Subsequently, a second manufacturing method of the semiconductor storage device 10 according to the present embodiment will be described with reference to FIGS. 10 to 13. FIGS. 10 to 13 illustrate plan views and cross-sectional views describing the respective processes of the second manufacturing method of the semiconductor storage device 10.

Note that, also in FIGS. 10 to 13, similarly to FIG. 2, the illustration of layers formed over the entire surface of the semiconductor substrate 100 is omitted. Furthermore, cross-sectional views illustrate the respective cross-sections obtained by cutting the plan views along an AA line, a BB line, and a CC line.

First of all, by processes similar to the processes described with reference to FIGS. 3 to 6, components up to the planarization film 200 are formed.

Figure 10:
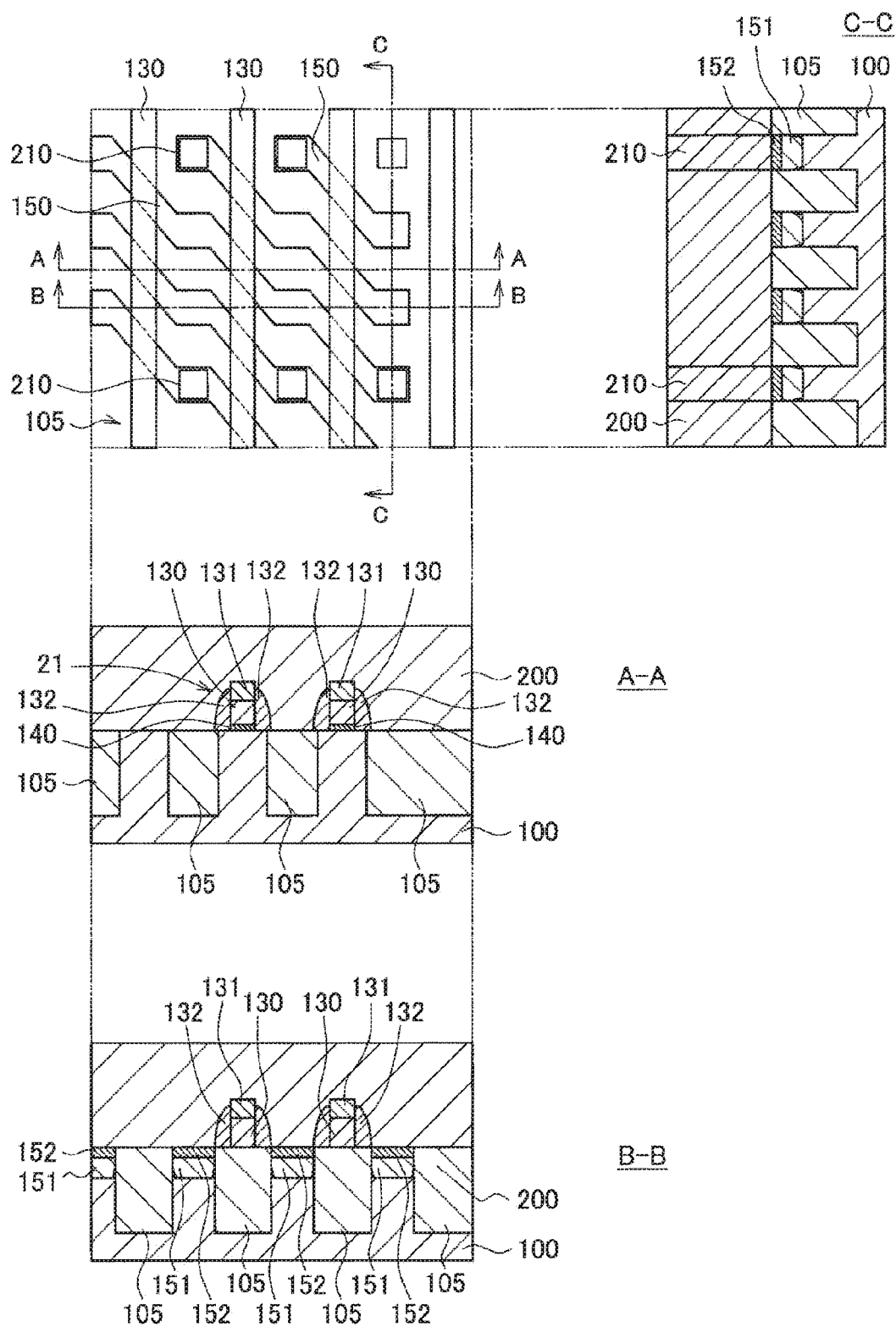
FIG. 10 illustrates a plan view and a cross-sectional view describing one process of a second manufacturing method of the semiconductor storage device.

Subsequently, as illustrated in FIG. 10, the contact 210 electrically connecting with the other one of the source or drain region 151 is formed.

Specifically, by etching the planarization film 200, an opening is formed on the other one of the source or drain region 151. Subsequently, by performing planarization using the CMP method after forming Ti and TiN films in the opening in the planarization film 200 using CVD or the like, and further forming a W film, the contact 210 is formed on the other one of the source or drain region 151. Note that the Ti and TiN films may be formed using a sputtering method that uses an ion metal plasma (IMP), or the like. Furthermore, planarization may be performed using whole-surface etch-back in place of the CMP method. Note that the contact 210 may be formed simultaneously with a contact of a transistor provided in a logic region other than a memory region.

Figure 11:
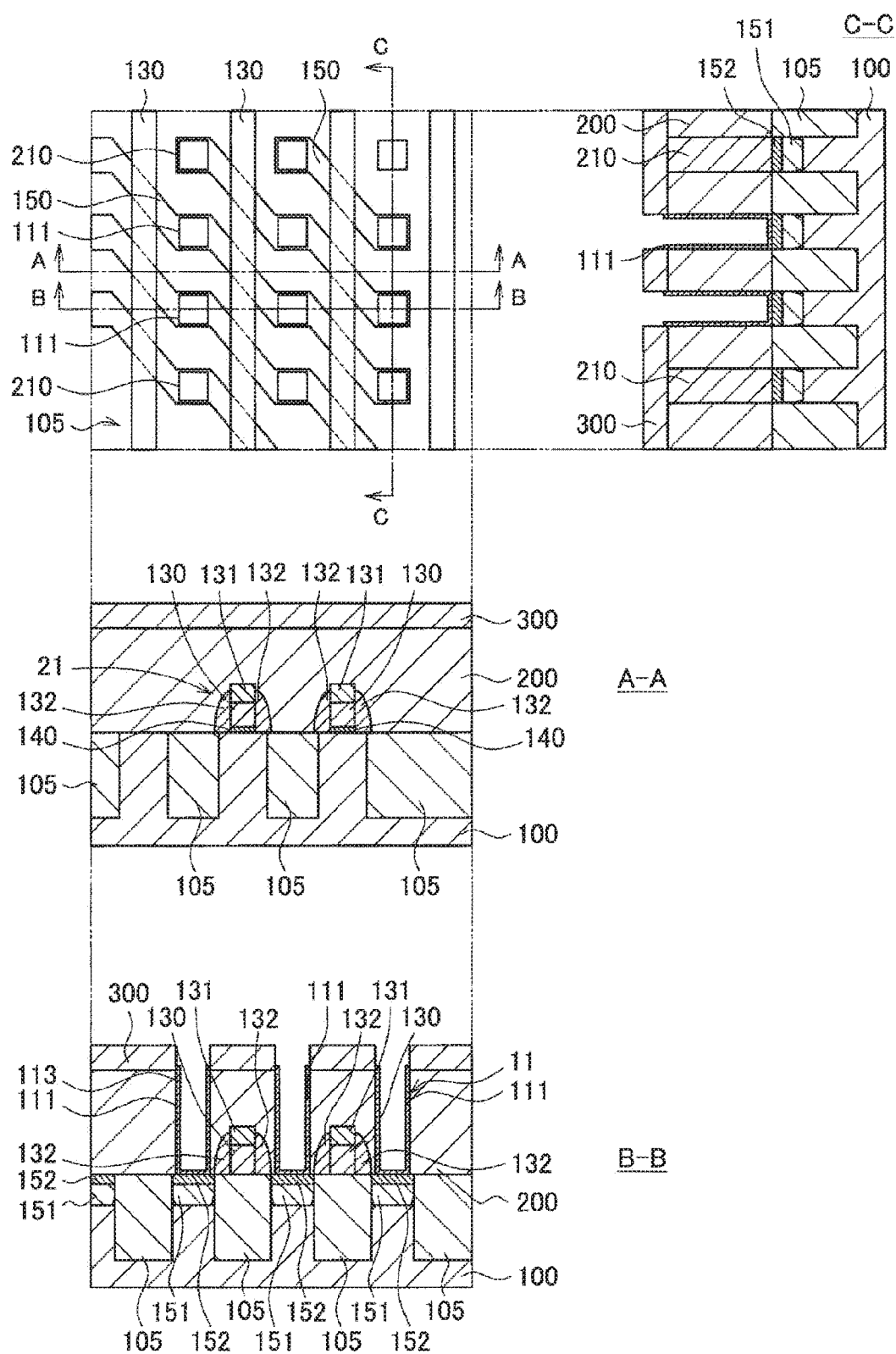
FIG. 11 illustrates a plan view and a cross-sectional view describing one process of the second manufacturing method of the semiconductor storage device.

Next, as illustrated in FIG. 11, after the interlayer insulating film 300 is formed over the entire surface of the semiconductor substrate 100, an opening penetrating through the planarization film 200 and the interlayer insulating film 300 and exposing the active region 150 is formed, and the first capacitor electrode 111 is formed inside the opening.

Specifically, by performing planarization using the CMP method after a SiO$_2$ film with a film thickness of 100 nm to 500 nm is formed using CVD or the like over the entire surface of the planarization film 200, the interlayer insulating film 300 is formed. Next, by anisotropic etching that uses a resist patterned by lithography as a mask, an opening is formed in the planarization film 200 and the interlayer insulating film 300 on the active region 150 corresponding to the other one of the source or drain region 151. The opening can be formed with a width of 60 nm and a depth of 200 nm, for example. At this time, if an aspect ratio of the opening is about 20, etching for forming the opening and filling of the opening by the film formation performed subsequently can be performed without problem. The anisotropic etching can be performed by using fluorocarbon-based gas, for example. Furthermore, by using the above-described linear layer, etching can be stopped with good controllability.

Next, using sputtering that is based on ALD, CVD, or IMP, a TiN film with a film thickness of 5 nm to 20 nm is formed on the source or drain region 151 along the internal shape of the opening formed in the planarization film 200 and the interlayer insulating film 300. Note that TaN, Ru, RuO$_2$, or the like can be used in place of TiN as material for forming the first capacitor electrode 111. Thereafter, after a resist is applied onto the formed first capacitor electrode 111, by performing etch-back under a condition under which the resist and the first capacitor electrode 111 become the subequal selectivity, the first capacitor electrode 111 is recessed from an opening surface of the opening. Therefore, it is possible to recess a shoulder portion of the first capacitor electrode 111 and form a recess while leaving the first capacitor electrode 111 on the bottom portion and the side surfaces of the opening.

Figure 12:
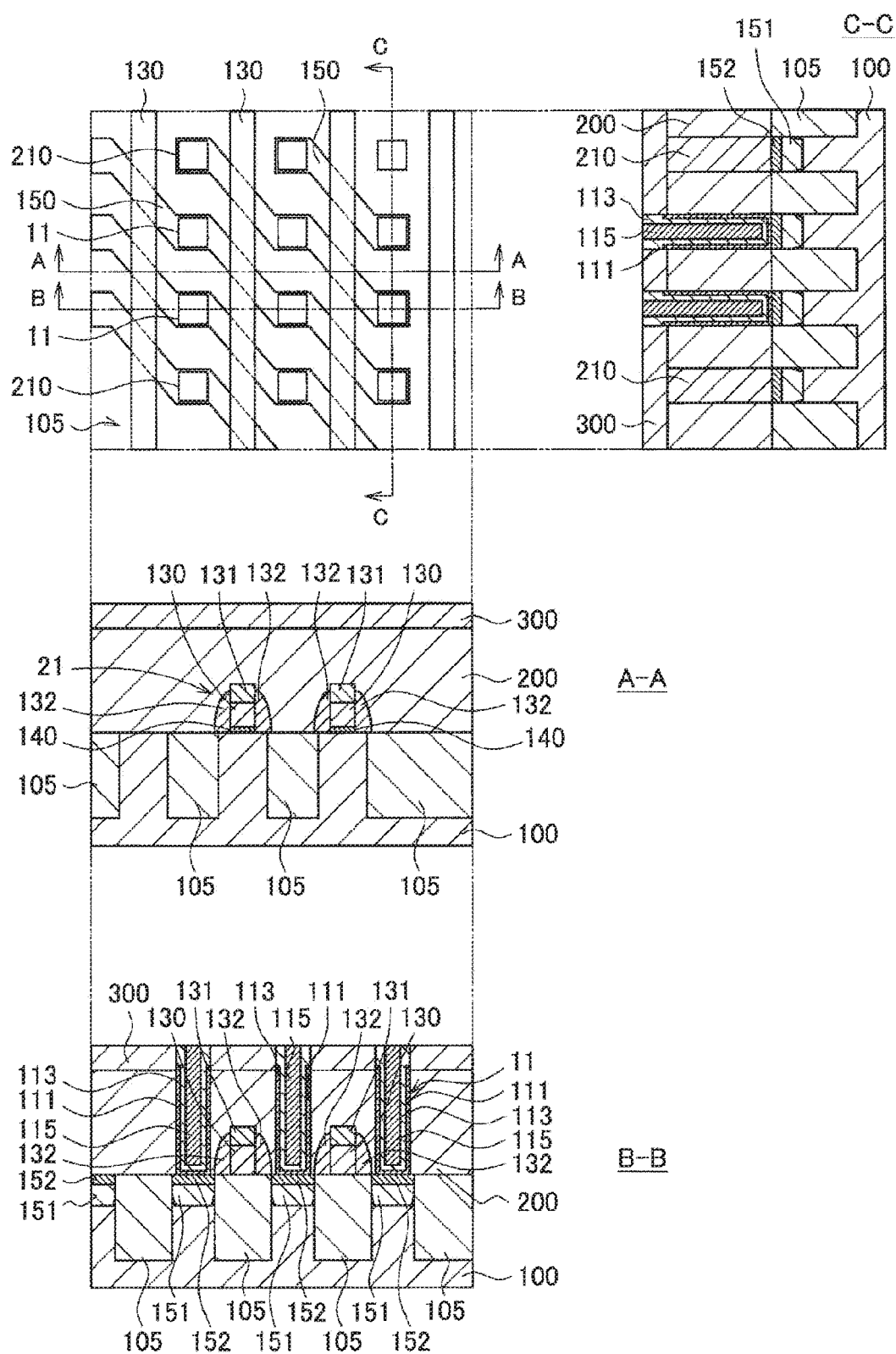
FIG. 12 illustrates a plan view and a cross-sectional view describing one process of the second manufacturing method of the semiconductor storage device.

Subsequently, as illustrated in FIG. 12, by forming the ferroelectric film 113 on the first capacitor electrode 111, and further forming the second capacitor electrode 115 on the ferroelectric film 113, the capacitor 11 is formed inside the opening.

Specifically, a film of hafnium oxide (HfO$_x$) being high dielectric material is formed with a film thickness of 3 nm to 10 nm using CVD or ALD on the first capacitor electrode 111 along the internal shape of the opening provided in the planarization film 200, and the ferroelectric film 113 is formed. Note that, by being subjected to annealing processing in a subsequent process, hafnium oxide (HfO$_x$) being high dielectric material is converted into ferroelectric material.

Note that high dielectric material such as zirconium oxide (ZrO$_x$) or hafnium zirconium oxide (HfZrO$_x$) can also be used in place of hafnium oxide. Furthermore, by doping these types of high dielectric material with lanthanum (La), silicon (Si), gadolinium (Gd), or the like, it is possible to convert these types of high dielectric material into ferroelectric material. Moreover, perovskite ferroelectric material such as piezoelectric zirconate titanate (PZT) or strontium bismuth tantalate (SBT) can also be used as the ferroelectric film 113.

Thereafter, by forming a TiN film with a film thickness of 5 nm to 20 nm on the ferroelectric film 113 using CVD, ALD, sputtering, or the like so as to fill the opening formed in the planarization film 200, the second capacitor electrode 115 is formed. Note that TaN, Ru, or RuO$_2$ can also be used as material for forming the second capacitor electrode 115.

Subsequently, crystallization annealing for converting HfO$_x$ included in the ferroelectric film 113 into ferroelectric material is performed. Note that the crystallization annealing for converting HfO$_x$ into ferroelectric material may be performed in this process, or may be performed in another process (for example, after CMP to be described later). The condition of the crystallization annealing can be arbitrarily changed without departing from the range of 400° C. to 700° C. and a heat resistance range of another configuration such as the transistor 21 and NiSi, for example. Thereafter, by performing CMP or whole-surface etch-back, the ferroelectric film 113 and the second capacitor electrode 115 that have been excessively formed on the planarization film 200 are removed. Therefore, the capacitor 11 is formed.

Figure 13:
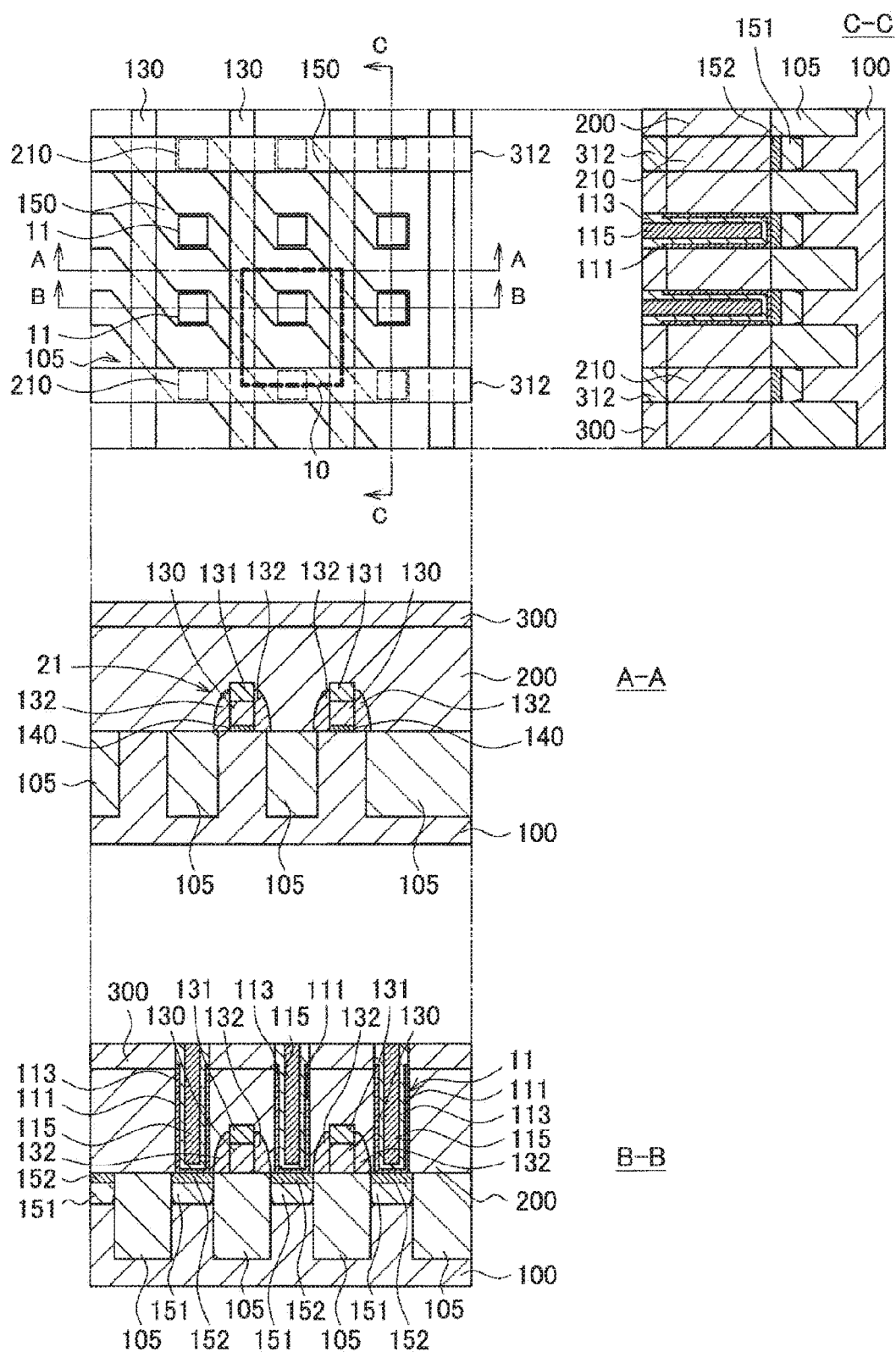
FIG. 13 illustrates a plan view and a cross-sectional view describing one process of the second manufacturing method of the semiconductor storage device.

Thereafter, as illustrated in FIG. 13, the second wiring layer 312 is formed.

Specifically, after an opening for electrically connecting with the contact 210 is formed by etching the interlayer insulating film 300, by using a damascene structure or a dual damascene structure, the second wiring layer 312 is formed using Cu or the like as wiring material. Note that the second wiring layer 312 may be formed by Al or the like. The second wiring layer 312 functions as the bit line BL by being extended in the second direction on the contact 210.

Note that the first wiring layer 311 (not illustrated) can be formed inside an interlayer insulating film on the second wiring layer 312 by repeating the formation of an interlayer insulating film, the formation of a contact penetrating through the formed interlayer insulating film, the formation of an interlayer insulating film filling the formed contact, and the formation of a wiring layer having a damascene structure and connecting with the contact.

According to the second manufacturing method, because a formation depth of the capacitor 11 can be increased by an amount corresponding to the thickness of the interlayer insulating film 300 as compared with the first manufacturing method, the capacitance of the capacitor 11 can be increased. Accordingly, the semiconductor storage device 10 manufactured using the second manufacturing method can store information more stably.

(3.3. Third Manufacturing Method)

Next, a third manufacturing method of the semiconductor storage device 10 according to the present embodiment will be described with reference to FIGS. 14 to 18. FIGS. 14 to 18 illustrate plan views and cross-sectional views describing the respective processes of the third manufacturing method of the semiconductor storage device 10.

Note that, also in FIGS. 14 to 18, similarly to FIG. 2, the illustration of layers formed over the entire surface of the semiconductor substrate 100 is omitted. Furthermore, cross-sectional views illustrate the respective cross-sections obtained by cutting the plan views along an AA line, a BB line, and a CC line.

First of all, by processes similar to the processes described with reference to FIGS. 3 to 4, components up to the gate electrode 130 are formed.

Figure 14:
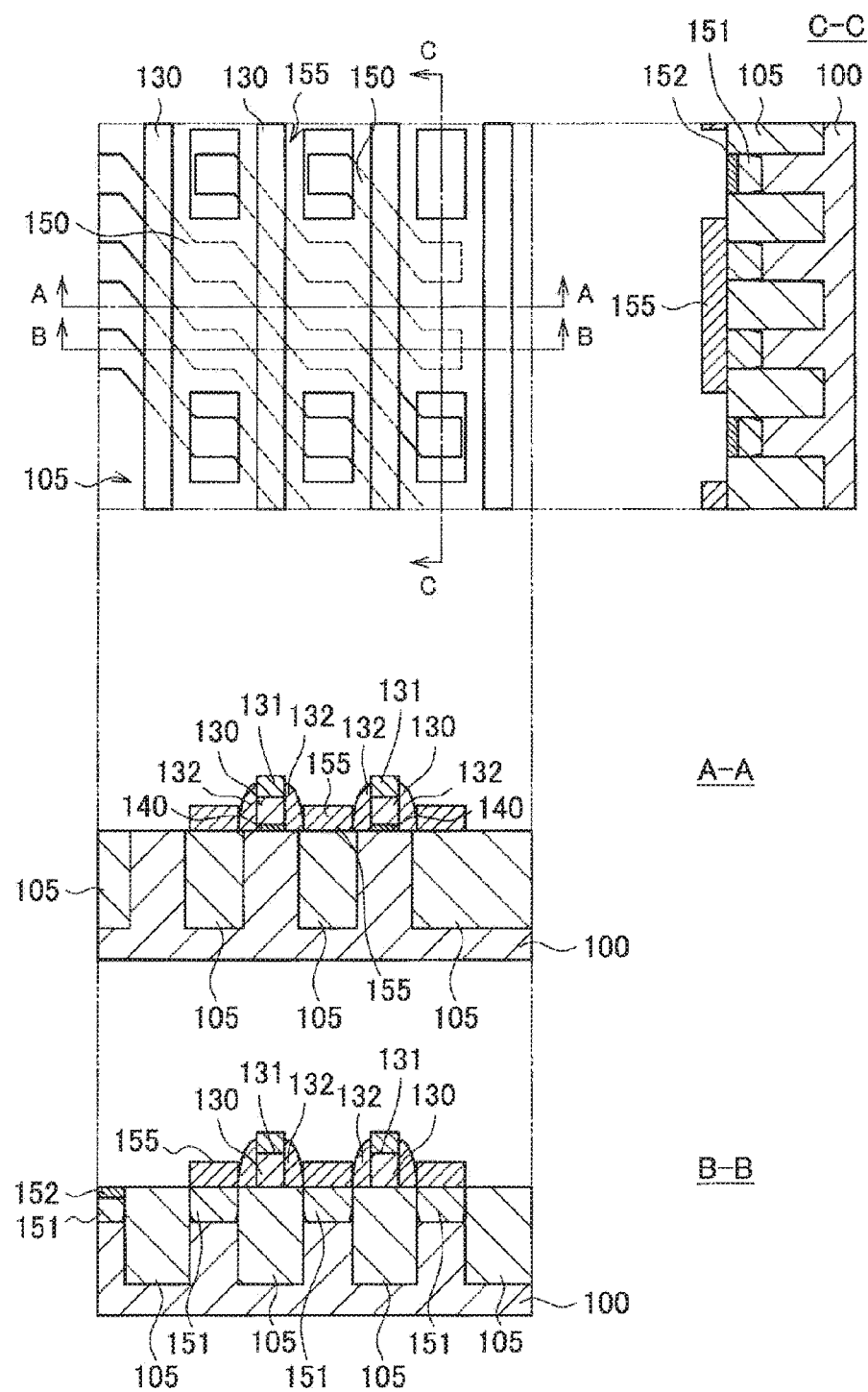
FIG. 14 illustrates a plan view and a cross-sectional view describing one process of a third manufacturing method of the semiconductor storage device.

Subsequently, as illustrated in FIG. 14, the side wall insulating films 132 are formed on both side surfaces of the gate electrode 130, and the source or drain region 151 is formed in the active region 150 of the semiconductor substrate 100. Nevertheless, in FIG. 14, by further forming a silicide block layer 155 on a partial region of the semiconductor substrate 100, a region in which the contact region 152 is not formed is provided in the semiconductor substrate 100.

Specifically, first of all, by performing ion implantation of arsenic (As) being the second conductivity type impure substance, at 5 keV to 20 keV and at the density of 5 to $20 \times 10^{13}/cm^2$, to both sides of the gate electrode 130, an LDD region is formed. Note that phosphorus (P) can also be used as the second conductivity type impure substance.

Subsequently, after a $SiO_2$ film with a film thickness of 10 nm to 30 nm is formed using plasma CVD, a $Si_3N_4$ film with a film thickness of 30 nm to 50 nm is using the plasma CVD, and an insulating film for side wall is formed. Thereafter, by performing anisotropic etching on the insulating film for side wall, the side wall insulating films 132 are formed on the both side surfaces of the gate electrode 130. At this time, after patterning is performed by lithography, the insulating film is etched in such a manner that only a region in which the contact region 152 is formed is opened, and the silicide block layer 155 is formed on the semiconductor substrate 100 in a region in which the contact region 152 is not formed. For example, the silicide block layer 155 may be formed on the semiconductor substrate 100 in a region other than the active region 150 in which the contact 210 is to be formed in a subsequent process.

Thereafter, ion implantation of arsenic (As) being the second conductivity type impure substance is performed at 20 keV to 50 keV and at the density of 1 to $2 \times 10^{15}/cm^2$, and the second conductivity type impure substance is introduced to the both sides of the gate electrode 130. Therefore, the source or drain regions 151 are formed in the active regions 150 on both sides of the gate electrode 130. Moreover, by performing rapid thermal annealing (RTA) for five seconds at 1000° C., an ion-implanted impure substance is activated. Therefore, the transistor 21 is formed. Note that, for promoting the activation of an introduced impure substance and suppressing the diffusion of the impure substance, it is also possible to activate the impure substance using spike RTA.

Subsequently, by performing RTA for 10 to 60 seconds at 300° C. to 450° C. after a Ni film with a film thickness of 6 nm to 8 nm is formed by sputtering or the like over the entire surface of the semiconductor substrate 100, Ni on Si is silicidized (NiSi). Because Ni on $SiO_2$ remains in an unreacted state, by removing unreacted Ni using $H_2SO_4$/$H_2O_2$, the conductive layer 131 including NiSi, and the contact region 152 are respectively formed on the gate electrode 130 and in the other one of source or drain region 151. Note that, by forming a Co or NiPt film in place of Ni, the conductive layer 131 and the contact region 152 may be formed by $CoSi_2$ or NiSi. The temperature of RTA in a case where a Co or NiPt film is formed is only required to be appropriately set.

At this time, in a region in which the silicide block layer 155 is formed, unreacted Ni remains on the silicide block layer 155 serving as an insulating film. Therefore, in the semiconductor substrate 100 in a region in which the silicide block layer 155 is formed, the silicidized contact region 152 is not formed.

Figure 15:
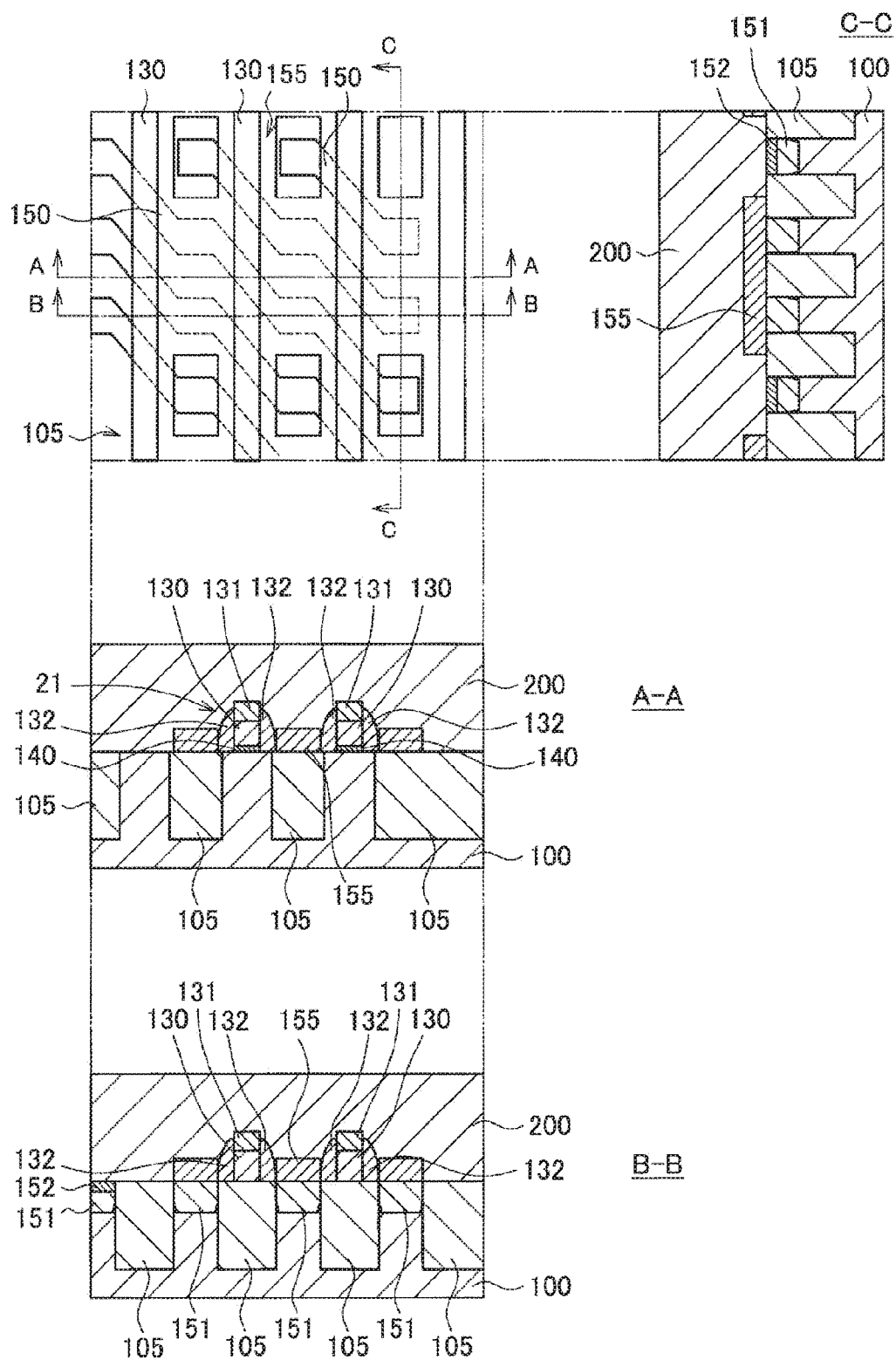
FIG. 15 illustrates a plan view and a cross-sectional view describing one process of the third manufacturing method of the semiconductor storage device.

Subsequently, as illustrated in FIG. 15, the planarization film 200 is formed over the entire surface of the semiconductor substrate 100 so as to bury the transistor 21.

Specifically, by performing planarization using the CMP method after a $SiO_2$ film with a film thickness of 100 nm to 500 nm is formed on the semiconductor substrate 100 and the silicide block layer 155 using CVD or the like, the planarization film 200 is formed.

Note that, before the planarization film 200 is formed, a linear layer, which is not illustrated and includes SiN, may be formed on the semiconductor substrate 100 over the entire surface of the semiconductor substrate 100. For example, by forming a SiN film with a film thickness of 10 nm to 50 nm using plasma CVD, the linear layer may be formed. The linear layer can also be formed as a layer that adds compression stress or tensile stress to the semiconductor substrate 100. By forming the linear layer, in a subsequent process, the planarization film 200 can be etched under a condition under which etching selectivity between the planarization film 200 and the linear layer becomes high. Thus, etching can be performed with higher controllability.

Figure 16:
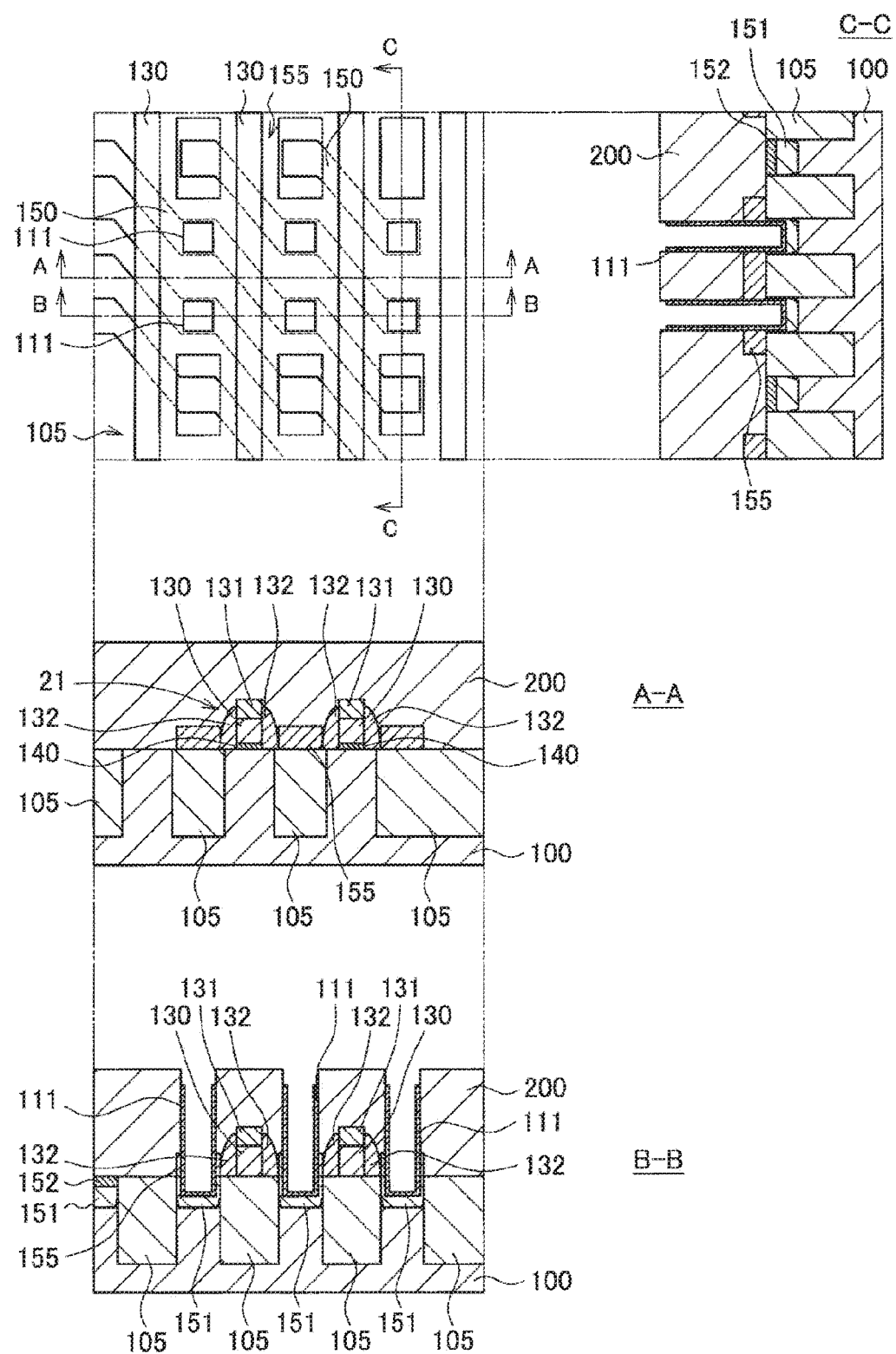
FIG. 16 illustrates a plan view and a cross-sectional view describing one process of the third manufacturing method of the semiconductor storage device.

Subsequently, as illustrated in FIG. 16, after an opening penetrating through the planarization film 200 and the silicide block layer 155 and reaching the inside of the semiconductor substrate 100 is formed, the first capacitor electrode 111 is formed inside the opening.

Specifically, by anisotropic etching that uses a resist patterned by lithography as a mask, an opening reaching the inside of the semiconductor substrate 100 is formed from the planarization film 200 on the other one of the source or drain region 151. The opening can be formed with a width of 60 nm and a depth of 200 nm, for example. Note that, if an aspect ratio of the opening is about 20, etching for forming the opening and filling of the opening by the film formation performed subsequently can be performed without problem. The anisotropic etching can be performed by using fluorocarbon-based gas, for example.

Next, using sputtering that is based on ALD, CVD, or IMP, a TiN film with a film thickness of 5 nm to 20 nm is formed on the source or drain region 151 along the internal shape of the formed opening. Note that TaN, Ru, $RuO_2$, or the like can be used in place of TiN as material for forming the first capacitor electrode 111. Thereafter, after a resist is applied onto the formed first capacitor electrode 111, by performing etch-back under a condition under which the resist and the first capacitor electrode 111 become the subequal selectivity, the first capacitor electrode 111 is recessed from an opening surface of the opening. Therefore, it is possible to recess a shoulder portion of the first capacitor electrode 111 and form a recess while leaving the first capacitor electrode 111 on the bottom portion and the side surfaces of the opening.

At this time, the opening is provided with penetrating through up to the active region 150 inside the semiconductor substrate 100 including the planarization film 200 and the silicide block layer 155. Accordingly, the first capacitor electrode 111 electrically connects with the source or drain region 151 on the side surfaces and the bottom surface of the opening. In the third manufacturing method, in a region in which the capacitor 11 is formed, because the formation of the contact region 152 is prevented by the silicide block layer 155, unintended leak or short circuit can be prevented from being generated between the first capacitor electrode 111 and the source or drain region 151.

Figure 17:
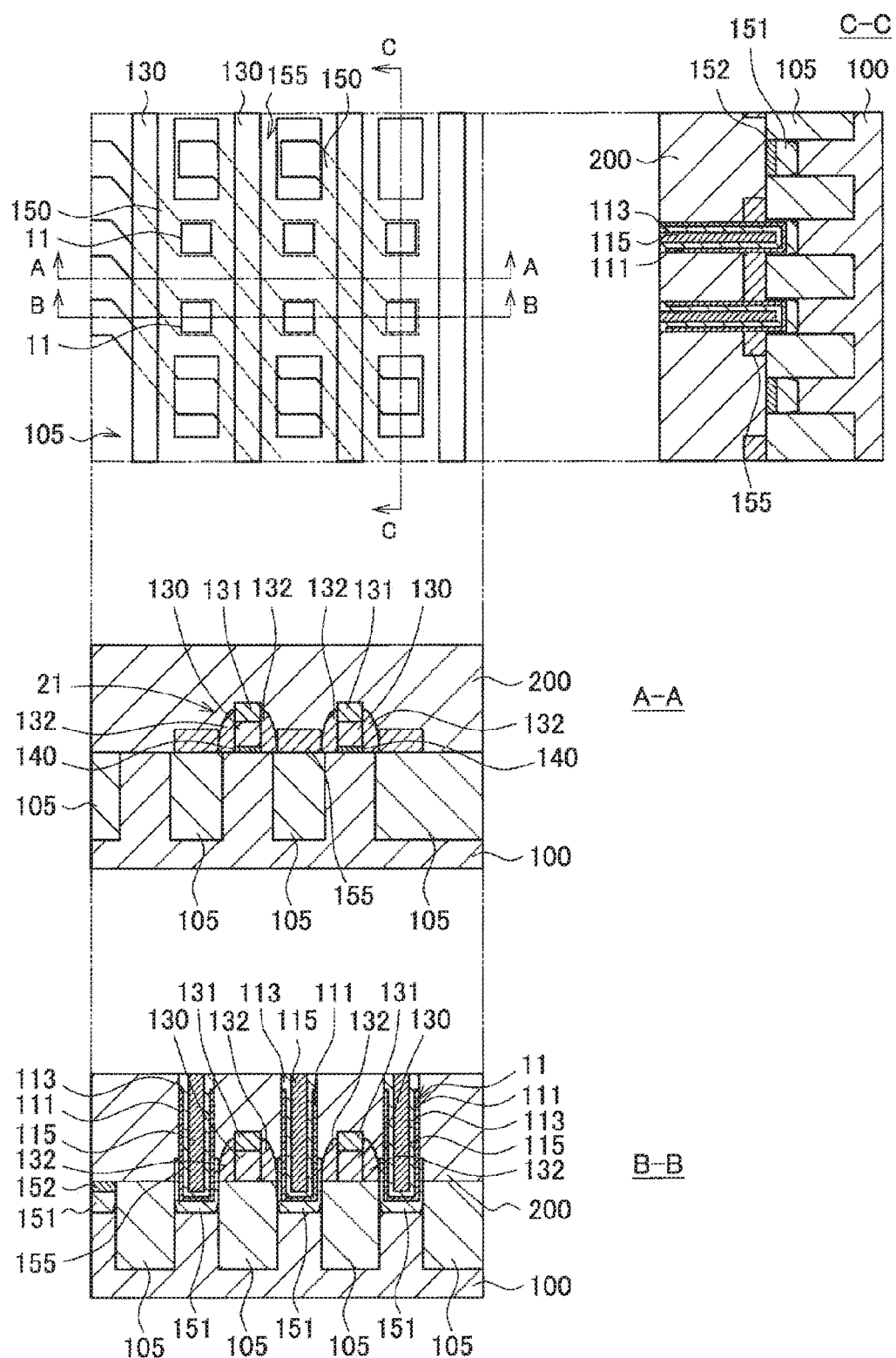
FIG. 17 illustrates a plan view and a cross-sectional view describing one process of the third manufacturing method of the semiconductor storage device.

Next, as illustrated in FIG. 17, by forming the ferroelectric film 113 on the first capacitor electrode 111, and further forming the second capacitor electrode 115 on the ferroelectric film 113, the capacitor 11 is formed inside the opening.

Specifically, a film of hafnium oxide ($HfO_x$) being high dielectric material is formed with a film thickness of 3 nm to 10 nm using CVD or ALD on the first capacitor electrode 111 along the internal shape of the opening provided in the planarization film 200, and the ferroelectric film 113 is formed. Note that, by being subjected to annealing processing in a subsequent process, hafnium oxide ($HfO_x$) being high dielectric material is converted into ferroelectric material.

Note that high dielectric material such as zirconium oxide ($ZrO_x$) or hafnium zirconium oxide ($HfZrO_x$) can also be used in place of hafnium oxide. Furthermore, by doping these types of high dielectric material with lanthanum (La), silicon (Si), gadolinium (Gd), or the like, it is possible to convert these types of high dielectric material into ferroelectric material. Moreover, perovskite ferroelectric material such as piezoelectric zirconate titanate (PZT) or strontium bismuth tantalate (SBT) can also be used as the ferroelectric film 113.

Thereafter, by forming a TiN film with a film thickness of 5 nm to 20 nm on the ferroelectric film 113 using CVD, ALD, sputtering, or the like so as to fill the opening formed in the planarization film 200, the second capacitor electrode 115 is formed. Note that TaN, Ru, or $RuO_2$ can also be used as material for forming the second capacitor electrode 115. Subsequently, crystallization annealing for converting $HfO_x$ included in the ferroelectric film 113 into ferroelectric material is performed. Note that the crystallization annealing for converting $HfO_x$ into ferroelectric material may be performed in this process, or may be performed in another process (for example, after CMP to be described later). The condition of the crystallization annealing can be arbitrarily changed without departing from the range of 400° C. to 700° C. and a heat resistance range of another configuration such as the transistor 21 and NiSi, for example. Thereafter, by performing CMP or whole-surface etch-back, the ferroelectric film 113 and the second capacitor electrode 115 that have been excessively formed on the planarization film 200 are removed. Therefore, the capacitor 11 is formed.

Figure 18:
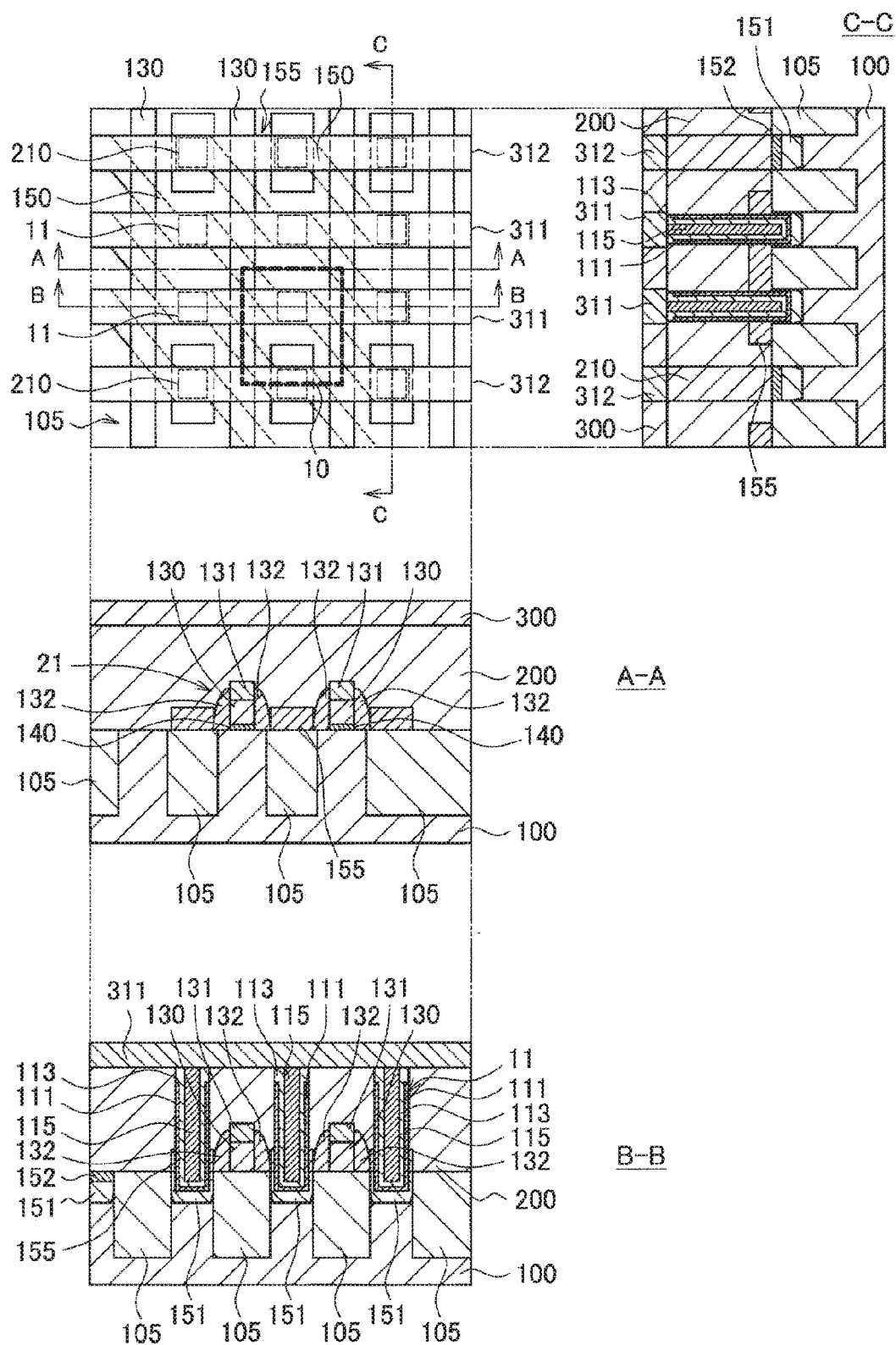
FIG. 18 illustrates a plan view and a cross-sectional view describing one process of the third manufacturing method of the semiconductor storage device.

Next, as illustrated in FIG. 18, after the contact 210 electrically connecting with the other one of the source or drain region 151 is formed, the interlayer insulating film 300 is formed over the entire surface of the semiconductor substrate 100, and the first wiring layer 311 and the second wiring layer 312 are formed.

Specifically, by etching the planarization film 200, an opening is formed on the other one of the source or drain region 151. Subsequently, by performing planarization using the CMP method after forming Ti and TiN films in the opening in the planarization film 200 using CVD or the like, and further forming a W film, the contact 210 is formed on the other one of the source or drain region 151. Note that the Ti and TiN films may be formed using a sputtering method that uses an ion metal plasma (IMP), or the like. Furthermore, planarization may be performed using whole-surface etch-back in place of the CMP method. Note that the contact 210 may be formed simultaneously with a contact of a transistor provided in a logic region or the like that is other than a region in which the semiconductor storage device 10 is formed.

Thereafter, by performing planarization using the CMP method after a $SiO_2$ film with a film thickness of 100 nm to 500 nm is formed using CVD or the like over the entire surface of the planarization film 200, the interlayer insulating film 300 is formed. Subsequently, after an opening for electrically connecting with the second capacitor electrode 115 or the contact 210 is formed by etching the interlayer insulating film 300, by using a damascene structure or a dual damascene structure, the first wiring layer 311 and the second wiring layer 312 are formed using Cu or the like as wiring material. Note that the first wiring layer 311 and the second wiring layer 312 may be formed by Al or the like. The first wiring layer 311 functions as the source line SL by being extended in the second direction on the second capacitor electrode 115. Furthermore, the second wiring layer 312 functions as the bit line BL by being extended in the second direction on the contact 210.

According to the third manufacturing method, because a formation depth of the capacitor 11 can be increased by a depth by which the semiconductor substrate 100 is dug in, as compared with the first manufacturing method, the capacitance of the capacitor 11 can be increased. Accordingly, the semiconductor storage device 10 manufactured using the third manufacturing method can store information more stably.

Note that the structure manufactured using the third manufacturing method can also be combined with the structure manufactured using the second manufacturing method. In such a case, the capacitor 11 is provided over the interlayer insulating film 300, the planarization film 200, and the semiconductor substrate 100. With this arrangement, because a formation depth of the capacitor 11 can be further increased, the semiconductor storage device 10 can increase the capacitance of the capacitor 11, and store information more stably.

4. Operation Example

Figure 19:
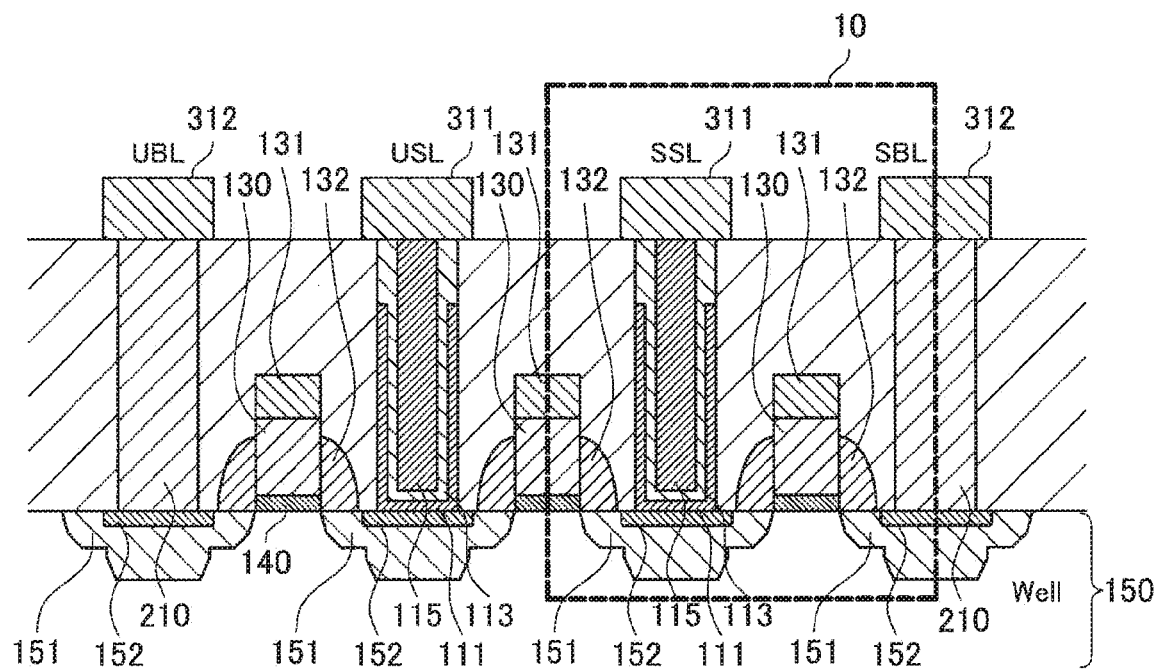
FIG. 19 is a cross-sectional view schematically illustrating a cross-section cut along an active region of the semiconductor storage device.

Subsequently, a writing operation and a readout operation of the above-described semiconductor storage device 10 will be described with reference to FIG. 19. FIG. 19 is a cross-sectional view schematically illustrating a cross-section cut along the active region 150 of the semiconductor storage device 10.

As illustrated in FIG. 19, the semiconductor storage device 10 includes the transistor 21, and the capacitor 11 connected to one of the source or drain region 151 of the transistor 21. The semiconductor storage device 10 is driven by the word line WL connected to the gate electrode 130 of the transistor 21, the bit line BL connected the other one of the source or drain region 151 of the transistor 21 via the contact 210, and the source line SL connected to the capacitor 11.

Table 1 given below is a table illustrating an example of a voltage (unit: V) to be applied to each of SWL, SBL, SSL, Well, UWL, UBL, and USL illustrated in FIG. 19, in the writing operation and the readout operation of the semiconductor storage device 10.

Note that, in Table 1, Vth denotes a threshold voltage for bringing the channel of the transistor 21 into the on state, and Vw denotes a voltage that can invert a polarization state of the capacitor 11. Furthermore, SWL, SBL, and SSL respectively denote the word line WL, the bit line BL, and the source line SL of a selected memory cell, and UWL, UBL, and USL respectively denote the word line WL, the bit line BL, and the source line SL of an unselected memory cell. Well denotes a potential of the active region 150 of the semiconductor substrate 100.

TABLE 1

|  | SWL | SBL | SSL | Well | UWL | UBL | USL |
| --- | --- | --- | --- | --- | --- | --- | --- |
| Write "1" | Vw + Vth | Vw | 0 | 0 | 0 | 0 | 0 |
| Write "0" | Vw + Vth | 0 | Vw | 0 | 0 | 0 | 0 |
| Readout | Vw + Vth | Vw | 0 | 0 | 0 | 0 | 0 |

For example, in a case where information indicating "1" is to be written into the semiconductor storage device 10, Vw+Vth is applied to the word line WL connecting to the selected semiconductor storage device 10, Vw is applied to the bit line BL, the source line SL is set to 0 V, and the active region 150 of the semiconductor substrate 100 is set to 0 V. Furthermore, the word line WL, the bit line BL, and the source line SL of the unselected semiconductor storage device 10 are each set to 0 V.

With this arrangement, because a potential of the other one of the source or drain region 151 of the transistor 21 becomes Vw by applying Vw to the bit line BL, a potential of the first capacitor electrode 111 of the capacitor 11 becomes Vw. On the other hand, because a potential of the source line SL is 0 V, a potential of the second capacitor electrode 115 becomes 0 V. Therefore, because a potential difference of Vw at which the first capacitor electrode 111 side becomes a higher potential is applied to the ferroelectric film 113 of the capacitor 11, a polarization state of the ferroelectric film 113 is controlled. Through the above-described operation, for example, information indicating "1" is written into the semiconductor storage device 10.

At this time, a potential of the source or drain region 151 of the transistor 21 becomes Vw, but in the unselected transistor 21, because the word line WL and the gate electrode 130 are set to 0 V, in the neighboring unselected semiconductor storage device 10, a potential is not applied to the first capacitor electrode 111. Accordingly, according to the present embodiment, it is possible to prevent information stored in the unselected semiconductor storage device 10, from being written when information is written into the selected semiconductor storage device 10.

Furthermore, in a case where information indicating "0" is to be written into the semiconductor storage device 10, Vw+Vth is applied to the word line WL connecting to the selected semiconductor storage device 10, and Vw is applied to the source line SL. The bit line BL is set to 0 V, and the active region 150 of the semiconductor substrate 100 is set to 0 V. Furthermore, the word line WL, the bit line BL, and the source line SL of the unselected semiconductor storage device 10 are each set to 0 V.

With this arrangement, because the bit line BL is set to 0 V, a potential of the other one of the source or drain region 151 of the transistor 21 becomes 0 V, and a potential of the first capacitor electrode 111 of the capacitor 11 becomes 0 V. On the other hand, because a potential of the source line SL is Vw, a potential of the second capacitor electrode 115 becomes Vw. Therefore, because a potential difference of Vw at which the second capacitor electrode 115 side becomes a higher potential is applied to the ferroelectric film 113 of the capacitor 11, a polarization state of the ferroelectric film 113 is controlled. Through the above-described operation, for example, information indicating "0" is written into the semiconductor storage device 10.

At this time, a potential of the source line SL becomes Vw, but in the unselected transistor 21, because the word line WL and the gate electrode 130 are set to 0 V, in the neighboring unselected semiconductor storage device 10, a potential is not applied to the first capacitor electrode 111. Accordingly, according to the present embodiment, it is possible to prevent information stored in the unselected semiconductor storage device 10, from being written when information is written into the selected semiconductor storage device 10.

Note that information readout from the semiconductor storage device 10 is performed utilizing a displacement current generated when "0" or "1" is written into the semiconductor storage device 10 changing depending on whether information stored before writing indicates "0" or "1".

For example, in Table 1, a voltage to be applied to a voltage to be applied to each of SWL, SBL, SSL, Well, UWL, UBL, and USL in a case where information is read out from the semiconductor storage device 10 by writing information indicating "1" is illustrated. In such a case, if information stored in the semiconductor storage device 10 indicates "1", an amount of displacement current becomes smaller. On the other hand, if information stored in the semiconductor storage device 10 indicates "0", an amount of displacement current becomes larger. Therefore, the semiconductor storage device 10 can determine whether stored information indicates which of "0" or "1".

Nevertheless, in a case where information is read out from the semiconductor storage device 10 by such a readout operation, information stored in the semiconductor storage device 10 is rewritten with "0" or "1" written at the time of readout. In other words, readout of information from the semiconductor storage device 10 becomes destructive readout. Accordingly, in the semiconductor storage device 10, after the readout operation, a rewriting operation of restoring information destroyed by the readout operation is performed.

5. Application Example

Figure 20A:
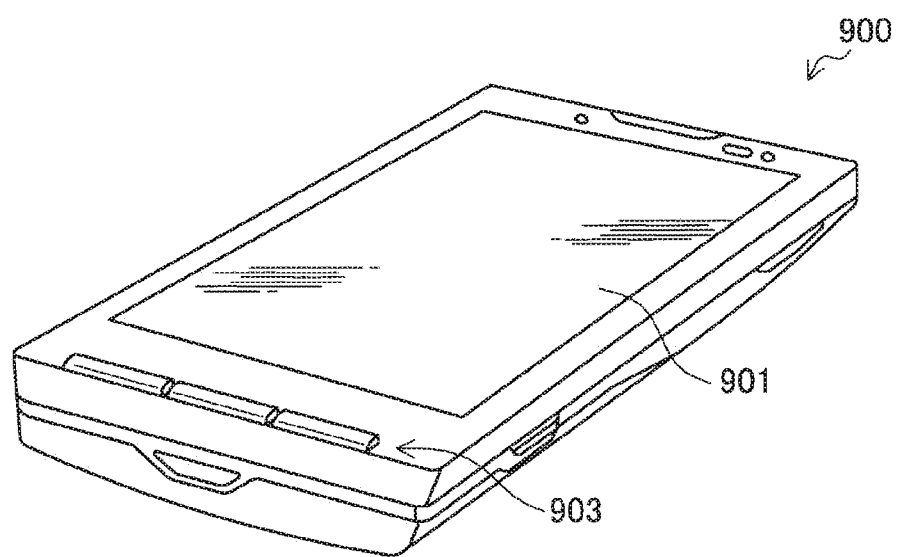
FIG. 20A is an external view illustrating an example of an electronic device according to an embodiment of the present disclosure.
Figure 20B:
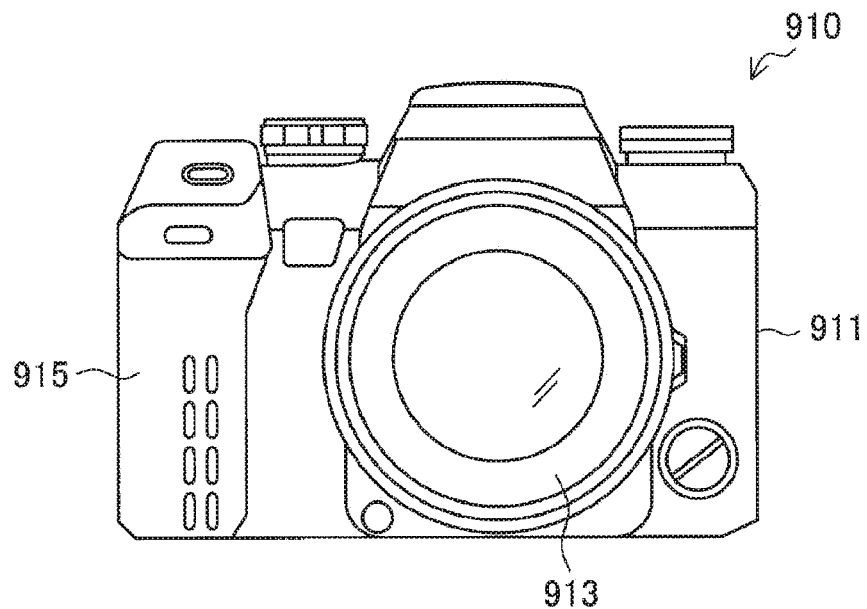
FIG. 20B is an external view illustrating an example of an electronic device according to an embodiment of the present disclosure.
Figure 20C:
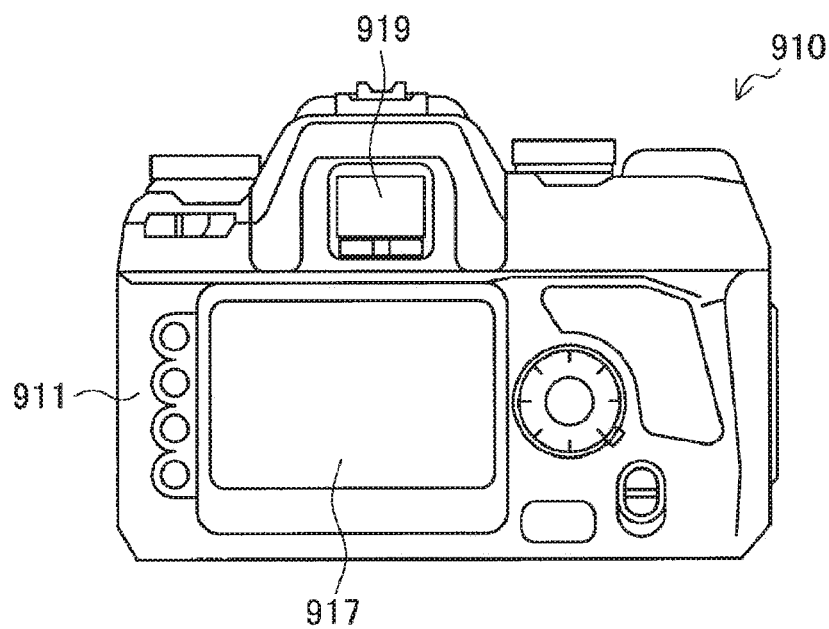
FIG. 20C is an external view illustrating an example of an electronic device according to an embodiment of the present disclosure.

Subsequently, an electronic device according to an embodiment of the present disclosure will be described. An electronic device according to an embodiment of the present disclosure corresponds to various types of electronic devices equipped with a circuit including the above-described semiconductor storage device 10. An example of such an electronic device according to the present embodiment will be described with reference to FIGS. 20A, 20B, and 20C. FIGS. 20A, 20B, and 20C are external views each illustrating an example of an electronic device according to the present embodiment.

For example, an electronic device according to the present embodiment may be an electronic device such as a smartphone. Specifically, as illustrated in FIG. 20A, a smartphone 900 includes a display unit 901 that displays various types of information, and an operation unit 903 including a button for receiving an operation input from a user, and the like. Here, a circuit mounted on the smartphone 900 may be provided with the above-described semiconductor storage device 10.

For example, an electronic device according to the present embodiment may be an electronic device such as a digital camera. Specifically, as illustrated in FIGS. 20B and 20C, a digital camera 910 includes a main body portion (camera body) 911, an interchangeable lens unit 913, a grip portion 915 to be gripped by a user during image capturing, a monitor unit 917 that displays various types of information, and an electronic view finder (EVF) 919 that displays a live view image observed by the user during image capturing. Note that FIG. 20B is an external view illustrating the digital camera 910 viewed from the front (that is, subject side), and FIG. 20C is an external view illustrating the digital camera 910 viewed from the rear side (that is, photographer side). Here, a circuit mounted on the digital camera 910 may be provided with the above-described semiconductor storage device 10.

Note that an electronic device according to the present embodiment is not limited to the above-described examples. An electronic device according to the present embodiment may be an electronic device of any field. Examples of such an electronic device include a glasses-type wearable device, a head mounted display (HMD), a television device, an electronic book, a personal digital assistant (PDA), a laptop computer, a video camera, a game device, and the like.

Heretofore, a preferred embodiment of the present disclosure has been described in detail with reference to the attached drawings, but the technical scope of the present disclosure is not limited to this example. It should be appreciated that a person who has general knowledge in the technical field of the present disclosure can conceive various change examples and modified examples within the scope of the technical idea described in the appended claims, and these change examples and modified examples are construed as naturally falling within the technical scope of the present disclosure.

Furthermore, the effects described in this specification are merely provided as explanatory or exemplary effects, and the effects are not limited. That is, the technology according to the present disclosure can bring about another effect obvious for the one skilled in the art, from the description in this specification, in addition to the above-described effects or in place of the above-described effects.

Note that the following configurations also fall within the technical scope of the present disclosure.

(1) A semiconductor storage device including:
a field-effect transistor provided in an active region of a semiconductor substrate;
a ferroelectric capacitor including a first capacitor electrode and a second capacitor electrode sandwiching a ferroelectric film, the first capacitor electrode being electrically connected to one of a source or a drain of the field-effect transistor;
a source line electrically connected to the second capacitor electrode of the ferroelectric capacitor; and
a bit line electrically connected to another one of the source or the drain of the field-effect transistor,
in which a gate electrode of the field-effect transistor extends in a first direction across the active region, and the source line and the bit line extend in a second direction orthogonal to the first direction.

(2) The semiconductor storage device according to (1) described above, in which the active region is provided in a belt-like shape extending in a third direction obliquely intersecting with both of the first direction and the second direction.

(3) The semiconductor storage device according to (2) described above, in which the active regions are separated from each other by an element separation layer provided on the semiconductor substrate.

(4) The semiconductor storage device according to any one of (1) to (3) described above, in which the gate electrode is electrically connected to a word line.

(5) The semiconductor storage device according to any one of (1) to (4) described above,
in which a planarization film burying the field-effect transistor is provided on the semiconductor substrate, and
the ferroelectric capacitor is provided inside an opening provided in the planarization film.

(6) The semiconductor storage device according to (5) described above, in which the ferroelectric capacitor includes the first capacitor electrode provided along a bottom surface and a side surface of the opening, the ferroelectric film provided on the first capacitor electrode along a shape of the opening, and the second capacitor electrode provided on the ferroelectric film to fill the opening.

(7) The semiconductor storage device according to (6) described above, in which the first capacitor electrode is provided with being recessed from an opening surface of the opening in the planarization film.

(8) The semiconductor storage device according to any one of (5) to (7) described above, in which the ferroelectric capacitor is provided on the active region.

(9) The semiconductor storage device according to (8) described above, in which the ferroelectric capacitor is provided on the active region corresponding to one of the source or the drain of the field-effect transistor.

(10) The semiconductor storage device according to any one of (5) to (9) described above, in which the source line and the bit line are provided in a same layer.

(11) The semiconductor storage device according to any one of (5) to (9) described above,
in which the bit line is provided inside an interlayer insulating film provided on the planarization film, and
the opening is provided with penetrating through from the interlayer insulating film up to a surface of the semiconductor substrate.

(12) The semiconductor storage device according to any one of (5) to (11) described above, in which the opening is provided with penetrating through from the planarization film up to an inside of the semiconductor substrate.

(13) A manufacturing method of a semiconductor storage device, the manufacturing method including:
forming a field-effect transistor in an active region of a semiconductor substrate in such a manner that a gate electrode of the field-effect transistor extends in a first direction across the active region;
forming a ferroelectric capacitor including a first capacitor electrode and a second capacitor electrode sandwiching a ferroelectric film, the first capacitor electrode being electrically connected with one of a source or a drain of the field-effect transistor; and
forming a source line electrically connected with the second capacitor electrode of the ferroelectric capacitor, and a bit line electrically connected to another one of the source or the drain of the field-effect transistor in such a manner that the source line and the bit line extend in a second direction orthogonal to the first direction.

(14) An electronic device including:
a semiconductor storage device including
a field-effect transistor provided in an active region of a semiconductor substrate,
a ferroelectric capacitor including a first capacitor electrode and a second capacitor electrode sandwiching a ferroelectric film, the first capacitor electrode being electrically connected to one of a source or a drain of the field-effect transistor,
a source line electrically connected to the second capacitor electrode of the ferroelectric capacitor, and
a bit line electrically connected to another one of the source or the drain of the field-effect transistor,
in which, in the semiconductor storage device, a gate electrode of the field-effect transistor extends in a first direction across the active region, and the source line and the bit line extend in a second direction orthogonal to the first direction.

REFERENCE SIGNS LIST

10 Semiconductor storage device
11 Capacitor
21 Transistor
100 Semiconductor substrate
105 Element separation layer
111 First capacitor electrode
113 Ferroelectric film
115 Second capacitor electrode
130 Gate electrode
131 Conductive layer
132 Side wall insulating film
140 Gate insulating film
150 Active region 151 Source or drain region
152 Contact region
200 Planarization film
210 Contact
300 Interlayer insulating film
311 First wiring layer
312 Second wiring layer

The invention claimed is:

1. A semiconductor storage device, comprising:
a field-effect transistor in an active region of a semiconductor substrate;
a ferroelectric capacitor including a ferroelectric film, a first capacitor electrode and a second capacitor electrode, wherein
the ferroelectric film is sandwiched between the first capacitor electrode and the second capacitor electrode, and
the first capacitor electrode is electrically connected to one of a source or a drain of the field-effect transistor;
a source line electrically connected to the second capacitor electrode of the ferroelectric capacitor; and
a bit line electrically connected to the other of the source or the drain of the field-effect transistor, wherein
the source line and the bit line are in a same layer,
a gate electrode of the field-effect transistor extends in a first direction across the active region, and the source line and the bit line extend in a second direction orthogonal to the first direction.

2. The semiconductor storage device according to claim 1, wherein
a shape of the active region is a belt shape that extends in a third direction, and
the third direction obliquely intersects with both of the first direction and the second direction.

3. The semiconductor storage device according to claim 2, wherein
the active region is separated by an element separation layer, and
the element separation layer is on the semiconductor substrate.

4. The semiconductor storage device according to claim 1, wherein the gate electrode is electrically connected to a word line.

5. The semiconductor storage device according to claim 1, wherein
a planarization film burying the field-effect transistor is on the semiconductor substrate, and
the ferroelectric capacitor is inside an opening in the planarization film.

6. The semiconductor storage device according to claim 5, wherein the ferroelectric capacitor includes the first capacitor electrode along a bottom surface and a side surface of the opening, the ferroelectric film on the first capacitor electrode along a shape of the opening, and the second capacitor electrode on the ferroelectric film to fill the opening.

7. The semiconductor storage device according to claim 6, wherein the first capacitor electrode is recessed from an opening surface of the opening in the planarization film.

8. The semiconductor storage device according to claim 5, wherein the ferroelectric capacitor is on the active region.

9. The semiconductor storage device according to claim 8, wherein the ferroelectric capacitor is on the active region corresponding to one of the source or the drain of the field-effect transistor.

10. The semiconductor storage device according to claim 5, wherein
the bit line is inside an interlayer insulating film that is on the planarization film, and
the opening penetrates through from the interlayer insulating film up to a surface of the semiconductor substrate.

11. The semiconductor storage device according to claim 5, wherein the opening penetrates through from the planarization film up to an inside of the semiconductor substrate.

12. An electronic device, comprising:
a semiconductor storage device that includes:
a field-effect transistor in an active region of a semiconductor substrate,
a ferroelectric capacitor including a ferroelectric film, a first capacitor electrode and a second capacitor electrode, wherein
the ferroelectric film is sandwiched between the first capacitor electrode and the second capacitor electrode, and
the first capacitor electrode is electrically connected to one of a source or a drain of the field-effect transistor,
a source line electrically connected to the second capacitor electrode of the ferroelectric capacitor, and
a bit line electrically connected to the other of the source or the drain of the field-effect transistor,
wherein
the source line and the bit line are in a same layer, and
in the semiconductor storage device, a gate electrode of the field-effect transistor extends in a first direction across the active region, and the source line and the bit line extend in a second direction orthogonal to the first direction.

* * * * *